US012701757B2

(12) United States Patent
Lin et al.

(10) Patent No.: US 12,701,757 B2
(45) Date of Patent: Aug. 4, 2026

(54) MANUFACTURING METHOD OF INTEGRATED CIRCUIT STRUCTURE

(71) Applicants: TAIWAN SEMICONDUCTOR MANUFACTURING COMPANY, LTD., Hsinchu (TW); NATIONAL YANG MING CHIAO TUNG UNIVERSITY, Hsinchu City (TW)

(72) Inventors: Hsin-Cheng Lin, Taipei City (TW); Yi-Chun Liu, Taichung City (TW); Kung-Ying Chiu, Taoyuan City (TW); Chee-Wee Liu, Taipei City (TW)

(73) Assignees: TAIWAN SEMICONDUCTOR MANUFACTURING COMPANY, LTD., Hsinchu (TW); NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 467 days.

(21) Appl. No.: 18/310,489

(22) Filed: May 1, 2023

(65) Prior Publication Data
US 2024/0371932 A1 Nov. 7, 2024

(51) Int. Cl.
H10D 62/10 (2025.01)
H10D 30/01 (2025.01)
(Continued)

(52) U.S. Cl.
CPC ......... H10D 62/121 (2025.01); H10D 30/014 (2025.01); H10D 30/43 (2025.01);
(Continued)

(58) Field of Classification Search
CPC .... H10D 62/121; H10D 30/014; H10D 30/43; H10D 30/6735; H10D 30/6757;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

TW 202316566 A 4/2023

OTHER PUBLICATIONS

Bilal Chehab, et al., "Design-technology co-optimization of sequential and monolithic CFET as enabler of technology hode beyond 2nm," Proc. of SPIE, vol. 11614, pp. 116140D1-116140D5 (2021).
(Continued)

*Primary Examiner* — Duy T Nguyen
(74) *Attorney, Agent, or Firm* — Maschoff Brennan

(57) ABSTRACT

An integrated circuit structure includes a substrate, a bottom nanostructure transistor, and a top nanostructure transistor. The bottom nanostructure transistor is over the substrate and includes a first channel layer, a first gate structure, and first source/drain epitaxial structures. The first gate structure wraps around the first channel layer. The first source/drain epitaxial structures are on opposite sides of the first channel layer. The top nanostructure transistor is over the bottom nanostructure transistor and includes a second channel layer, a second gate structure, and second source/drain epitaxial structures. The second channel layer is over the first channel layer. The second gate structure wraps around the second channel layer. A bottom surface of the second gate structure is substantially coplanar with a bottom surface of the first gate structure. The second source/drain epitaxial structures are on opposite sides of the second channel layer.

20 Claims, 25 Drawing Sheets

(51) Int. Cl.

| | |
|---|---|
| *H10D 30/43* | (2025.01) |
| *H10D 30/67* | (2025.01) |
| *H10D 64/01* | (2025.01) |
| *H10D 84/01* | (2026.01) |
| *H10D 84/03* | (2025.01) |
| *H10D 84/85* | (2025.01) |

(52) U.S. Cl.
CPC ..... *H10D 30/6735* (2025.01); *H10D 30/6757* (2025.01); *H10D 64/017* (2025.01); *H10D 84/0167* (2025.01); *H10D 84/017* (2025.01); *H10D 84/038* (2025.01); *H10D 84/85* (2025.01)

(58) Field of Classification Search
CPC ............. H10D 64/017; H10D 84/0167; H10D 84/017; H10D 84/038; H10D 84/85
USPC ........................................................ 438/151
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 10,559,594 | B2 | 2/2020 | Tarakji et al. |
| 11,315,938 | B1 * | 4/2022 | Reznicek ............... H10B 20/36 |
| 2014/0264276 | A1 * | 9/2014 | Chang ............... H10D 30/6757 |
| | | | 438/300 |
| 2015/0214318 | A1 * | 7/2015 | Ching ............... H10D 30/6735 |
| | | | 438/157 |
| 2016/0111513 | A1 * | 4/2016 | Liu ...................... H10D 30/014 |
| | | | 438/163 |
| 2016/0163796 | A1 * | 6/2016 | Obradovic ......... H10D 30/6757 |
| | | | 257/9 |
| 2018/0277628 | A1 * | 9/2018 | Bi ........................ H10D 62/149 |
| 2019/0131395 | A1 * | 5/2019 | Lee ..................... H10D 64/017 |
| 2020/0035569 | A1 * | 1/2020 | Frougier ........... H10D 84/0188 |
| 2020/0279918 | A1 * | 9/2020 | Wu ........................ H10D 30/43 |
| 2021/0210489 | A1 * | 7/2021 | Zhang ................ H10D 84/0188 |
| 2021/0265345 | A1 * | 8/2021 | Xie ..................... H10D 62/116 |
| 2022/0336456 | A1 * | 10/2022 | Hong ................... H10D 84/038 |
| 2023/0090092 | A1 * | 3/2023 | Lilak ................... H10D 62/121 |
| | | | 257/369 |

OTHER PUBLICATIONS

R. Ritzenthaler, et al., "Comparison of Electrical Performance of Co-Integrated Forksheets and Nanosheets Transistors for the 2nm Technological Node and Beyond," 2021 IEEE International Electron Devices Meeting (IEDM), pp. 26.2.1-26.2.4 (2021).

* cited by examiner

MANUFACTURING METHOD OF INTEGRATED CIRCUIT STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process can increase production efficiency and lower associated costs. Such scaling down has also increased the complexity of processing and manufacturing ICs and, for these advancements to be realized, similar developments in IC processing and manufacturing are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
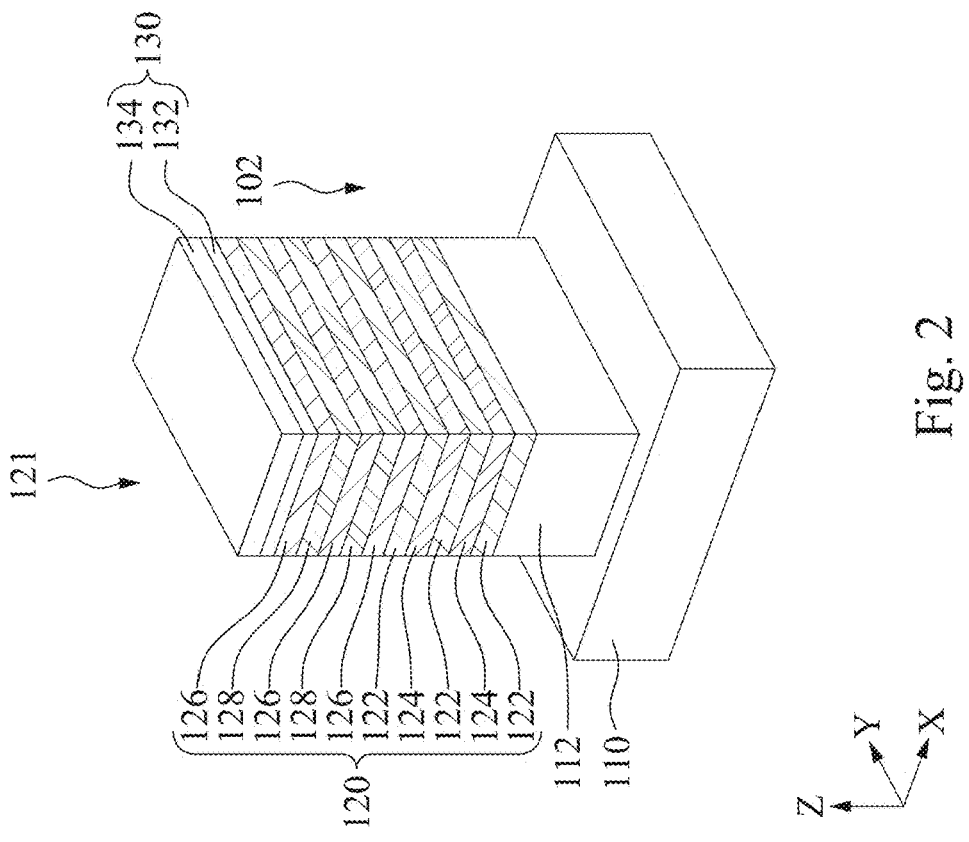
FIGS. 1-21C illustrate perspective views and cross-sectional views of intermediate stages in the formation of an integrated circuit structure (or a semiconductor device) in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term "etch selectivity" refers to the ratio of the etch rates of two different materials under the same etching conditions. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9). As used herein, the term "low-k" refers to a low dielectric constant. In the field of semiconductor device structures and manufacturing processes, low-k refers to a dielectric constant that is less than the dielectric constant of $SiO_2$ (e.g., less than 3.9). As used herein, the term "p-type" defines a structure, layer, and/or region as being doped with p-type dopants, such as boron. As used herein, the term "n-type" defines a structure, layer, and/or region as being doped with n-type dopants, such as phosphorus. As used herein, the term "conductive" refers to an electrically conductive structure, layer, and/or region. As used herein, source/drain region(s) may refer to a source or a drain, individually or collectively dependent upon the context.

The nanostructure transistor (e.g. gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit structures and methods of forming the same. More particularly, some embodiments of the present disclosure are related to complementary FET (CFET) devices including individual fork-sheet gate structures surrounded by the same gate spacer.

FIGS. 1-21C illustrate perspective views and cross-sectional views of intermediate stages in the formation of an integrated circuit structure (or a semiconductor device) 100a in accordance with some embodiments of the present disclosure. In some embodiments, the semiconductor device in FIGS. 21A-21C is a CFET device. In addition to the integrated circuit structure, FIGS. 1-7A depict X-axis, Y-axis, and Z-axis directions. The formed devices include a p-type transistor (such as a p-type GAA FET) and an n-type transistor (such as an n-type GAA FET) in accordance with some exemplary embodiments. Throughout the various views and illustrative embodiments, like reference numbers are used to designate like elements. It is understood that additional operations can be provided before, during, and after the processes shown by FIGS. 1-21C, and some of the operations described below can be replaced or eliminated, for additional embodiments of the method. The order of the operations/processes may be interchangeable.

FIGS. 1-7A are perspective views of some embodiments of the semiconductor device 100a at intermediate stages during fabrication. FIGS. 7B, 8A, 9A, 10A, 11A, 12A, 13A, 14A, 15A, 16A, 17A, 18A, 19A, 20A, and 21A are cross-sectional views of some embodiments of the semiconductor device 100a at intermediate stages during fabrication along a first cut (e.g., cut I-I in FIG. 7A). FIGS. 7C, 8B, 9B, 10B, 11B, 12B, 13B, 14B, 15B, 16B, 17B, 18B, 19B, 20B, and 21B are cross-sectional views of some embodiments of the semiconductor device 100a at intermediate stages during fabrication along a second cut (e.g., cut II-II in FIG. 7A). FIG. 21C is a cross-sectional view of some embodiments of the semiconductor device 100a at intermediate stages during fabrication along a third cut (e.g., cut III-III in FIG. 7A).

Figure 1:
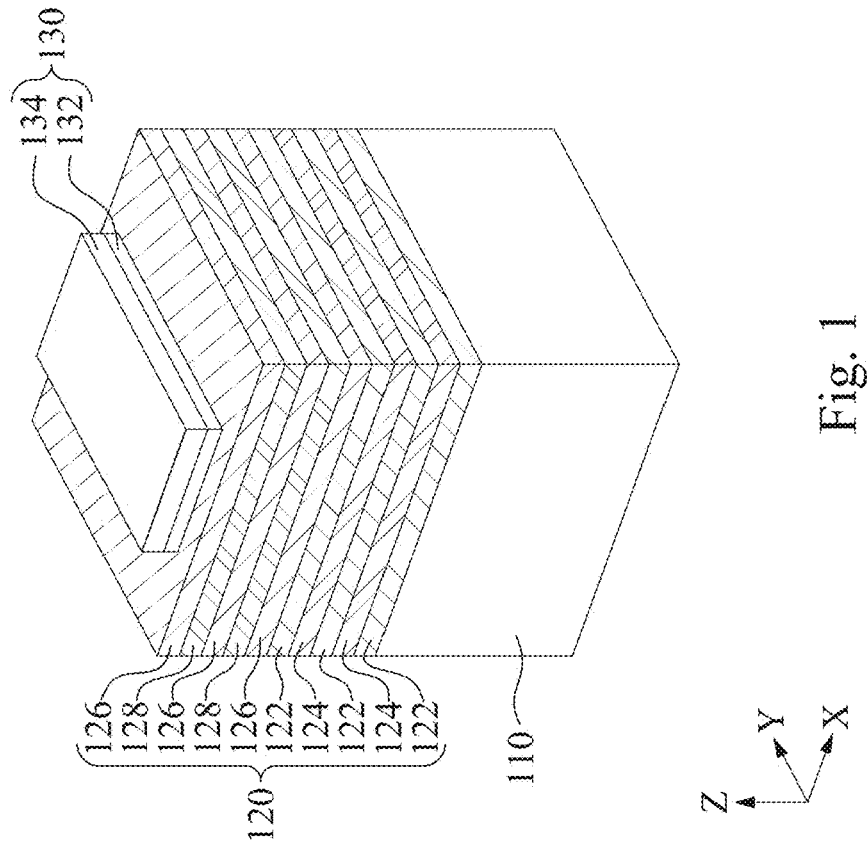

Referring to FIG. 1, an epitaxial stack 120 is formed over a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or combinations thereof) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method.

The epitaxial stack 120 includes epitaxial layers 122, 124, 126, and 128. The epitaxial layers 122 are of a first composition interposed by the epitaxial layers 124 of a second composition, and the epitaxial layers 126 are of a third composition interposed by the epitaxial layers 128 of a fourth composition. The first, second, third, and fourth compositions are different. In some embodiments, the epitaxial layers 122, 126, and 128 are Ge-rich layers and the epitaxial layers 124 are Si-rich layers. However, other embodiments are possible including those that provide for a first composition and a second composition having different etch selectivity.

By way of example, epitaxial growth of the layers of the epitaxial stack 120 may be performed by a molecular beam epitaxy (MBE) process, a metalorganic chemical vapor deposition (MOCVD) process, and/or other suitable epitaxial growth processes. In some embodiments, the epitaxial layers 122, 124, 126, and 128 include different materials from the substrate 110. As stated above, in at least some examples, the epitaxial layers 122, 124, and 126 include epitaxially grown silicon germanium (SiGe) layers with different compositions and the epitaxial layers 128 include an epitaxially grown GeSn layer. Alternatively, in some embodiments, either of the epitaxial layers 122, 124, 126, and 128 may include other materials such as germanium, tin, a compound semiconductor such as silicon carbide, gallium arsenide, gallium phosphide, indium phosphide, indium arsenide, and/or indium antimonide, an alloy semiconductor such as $Si_{1-x}Ge_x$, $Ge_{1-y}Sn_y$, $Si_{1-x-y}Ge_xSn_y$, $Ga_{1-x-y}As_xP_y$, $Al_{1-x-y}In_xAs_y$, $Al_{1-x-y}Ga_xAs_y$, $In_{1-x-y}Ga_xAs_y$, $Ga_{1-x-y}In_xP_y$, and/or $Ga_{1-x-y-z}In_xAs_yP_z$, III-V, or combinations thereof. As discussed, the materials of the epitaxial layers 122, 124, 126, and 128 may be chosen based on providing differing etching selectivity properties.

For example, the epitaxial layers 122 are $Si_{x1}Ge_{y1}$, the epitaxial layers 124 are $Si_{x2}Ge_{y2}$, the epitaxial layers 126 are $Si_{x3}Ge_{y3}$, and the epitaxial layers 128 are $Ge_{y4}Sn_{z1}$. The silicon atomic concentration of the epitaxial layers 124 is higher than the silicon atomic concentration of the epitaxial layers 122 and 126. On contrary, the silicon atomic concentration of the epitaxial layers 128 is lower than the silicon atomic concentration of the epitaxial layers 122 and 126. For example, x2 is greater than x1 and x3. Further, the silicon atomic concentration of the epitaxial layers 128 is substantially 0 or lower than 1%. The germanium atomic concentration of the epitaxial layers 122, 124, 126, and 128 are different. For example, but not limited to, y4>y1>y3>y2.

In some embodiments, x1 is in a range from about 0.15 to about 0.25, y1 is in a range from about 0.75 to about 0.85, x2 is in a range from about 0.55 to about 0.65, y2 is in a range from about 0.35 to about 0.45, x3 is in a range from about 0.35 to about 0.45, y3 is in a range from about 0.55 to about 0.65, y4 is in a range from about 0.85 to about 0.95, and z1 is in a range from about 0.05 to about 0.15.

The epitaxial layers 124 and 128 or portions thereof may form nanostructure channel(s) of the nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry. The use of the epitaxial layers 124 and 128 to define a channel or channels of a device is further discussed below.

In FIG. 1, the epitaxial layers 126 and 128 are disposed above the epitaxial layers 122 and 124. It is noted that two layers of the epitaxial layers 124 and two layers of the epitaxial layers 128 are arranged as illustrated in FIG. 1, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of each of the epitaxial layers 124 and 128 is between 1 and 100, e.g., between 2 and 10.

In some embodiments, each of the epitaxial layers 122, 124, 126, and 128 is in a range from about 0.1 nm to about 100 nm. Further, the epitaxial layers 122 may have different thicknesses, the epitaxial layers 124 may have different thicknesses, the epitaxial layers 126 may have different thicknesses, and/or the epitaxial layers 128 may have different thicknesses.

As described in more detail below, the epitaxial layers 124 and 128 may serve as channel region(s) for a subsequently-formed semiconductor device and the thickness is chosen based on device performance considerations. The epitaxial layers 122 and 126 in channel regions(s) may eventually be removed and serve to define a vertical distance between adjacent channel region(s) for a subsequently-formed multi-gate device and the thickness is chosen based on device performance considerations. Accordingly, the epitaxial layers 122 and 126 may also be referred to as sacrificial layers, and epitaxial layers 124 and 128 may also be referred to as channel layers.

Referring to FIG. 2, at least one fin structure 121 extending from the substrate 110 is formed. In various embodiments, the fin structure 121 is formed over a protruding portion 112 formed from the substrate 110 and includes portions of each of the epitaxial layers 122, 124, 126, and 128 of the epitaxial stack 120. The fin structure 121 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structure 121 by etching the epitaxial stack 120. The etching process can include dry etching, wet etching, reactive ion etching (RIE), and/or other suitable processes.

In the illustrated embodiment as illustrated in FIGS. 1 and 2, a hard mask (HM) layer 130 is formed over the epitaxial stack 120 prior to patterning the fin structure 121. In some embodiments, the HM layer 130 includes an oxide layer 132 (e.g., a pad oxide layer that may include $SiO_2$) and a nitride layer 134 (e.g., a pad nitride layer that may include $Si_3N_4$) formed over the oxide layer 132. The oxide layer 132 may act as an adhesion layer between the epitaxial stack 120 and the nitride layer 134 and may act as an etch stop layer for etching the nitride layer 134. In some examples, the oxide layer 132 includes thermally grown oxide, chemical vapor deposition (CVD)-deposited oxide, and/or atomic layer deposition (ALD)-deposited oxide. In some embodiments, the nitride layer 134 is deposited on the oxide layer 132 by CVD and/or other suitable techniques.

The fin structure 121 may subsequently be fabricated using suitable processes including photolithography and etch processes. The photolithography process may include forming a photoresist layer (not shown) over the HM layer 130, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-200 nm. The patterned mask may then be used to protect regions of the substrate 110, and layers formed thereupon, while an etch process forms trenches 102 in unprotected regions through the HM layer 130, through the epitaxial stack 120, and into the substrate 110, thereby leaving the fin structure 121. The trenches 102 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fin structure 121.

Figure 3:
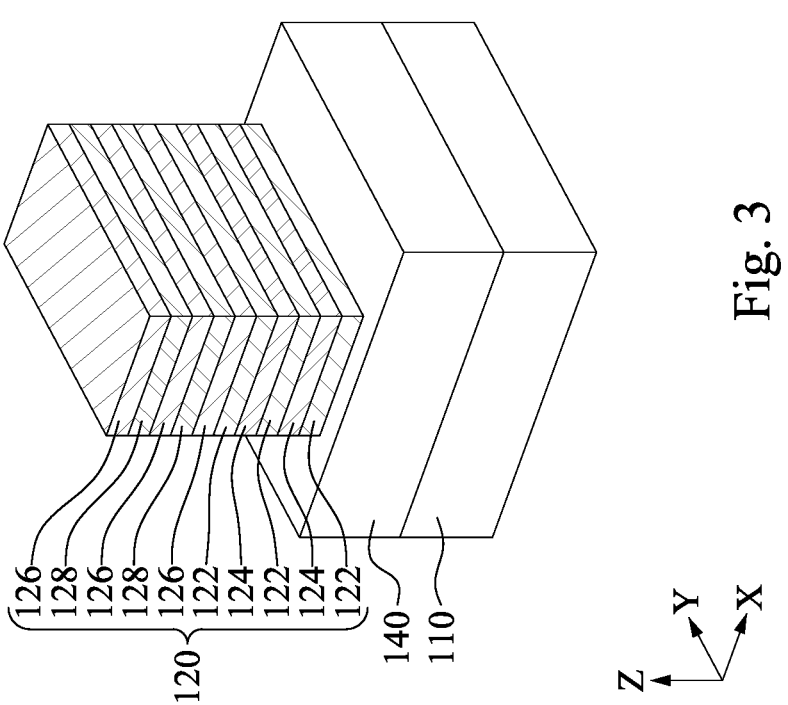

Next, as illustrated in FIG. 3, an isolation structure 140 is formed to surround the fin structure 121. The isolation structure 140 may include a liner oxide (not shown). The liner oxide may be formed of a thermal oxide formed through a thermal oxidation of a surface layer of the substrate 110. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The isolation structure 140 may also include a dielectric material over the liner oxide, and the dielectric material may be formed using flowable chemical vapor deposition (FCVD), spin-on coating, or the like.

The isolation structure 140 is then planarized until a top surface of the fin structure 121 is exposed. That is, the hard mask layer 130 (see FIG. 2) is removed. Subsequently, the isolation structure 140 is recessed, so that the top portion of the fin structure 121 protrudes higher than the top surface of the isolation structure 140. The etching may be performed using a dry etching process, wherein $NH_3$ and $NF_3$ are used as the etching gases. In accordance with alternative embodiments of the present disclosure, the recessing of the isolation structure 140 is performed using a wet etch process. The etching chemical may include diluted HF, for example.

Figure 4:
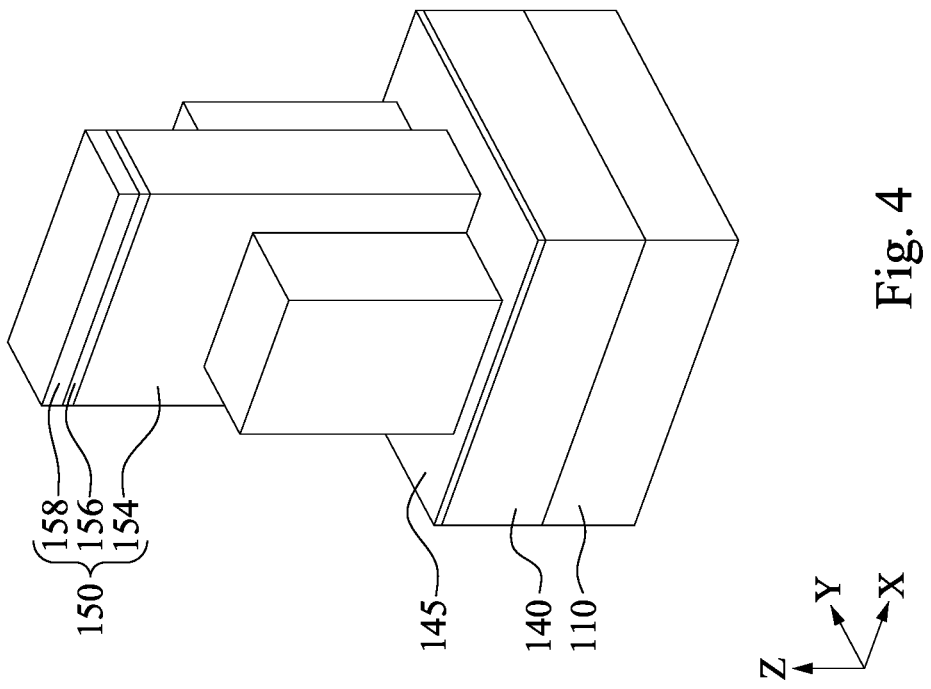

Reference is made to FIG. 4. A dummy gate dielectric layer 145 is conformally formed over the structure illustrated in FIG. 3. Subsequently, at least one dummy gate structure 150 is formed over the dummy gate dielectric layer 145 and is partially disposed over the fin structure 121. The portion of the fin structure 121 underlying the dummy gate structure 150 may be referred to as the channel region. The dummy gate structure 150 may also define source/drain regions S/D (labeled in FIG. 7B) of the fin structure 121, for example, the regions of the fin structure 121 adjacent and on opposing sides of the channel region.

In some embodiments, the dummy gate dielectric layer 145 is made of silicon dioxide, silicon nitride, a high-K dielectric material or other suitable material. Dummy gate formation operation forms a dummy gate electrode layer and a hard mask which may include multiple layers (e.g., an oxide layer and a nitride layer) over the dummy gate electrode layer. The hard mask is then patterned, followed by patterning the dummy gate electrode layer by using the patterned hard mask as an etch mask. The etch process may include a wet etch, a dry etch, and/or combinations thereof. As such, a dummy gate structure 150 including a dummy gate electrode layer 154 and a hard mask (e.g., an oxide layer 156 and a nitride layer 158) is formed.

Figure 5:
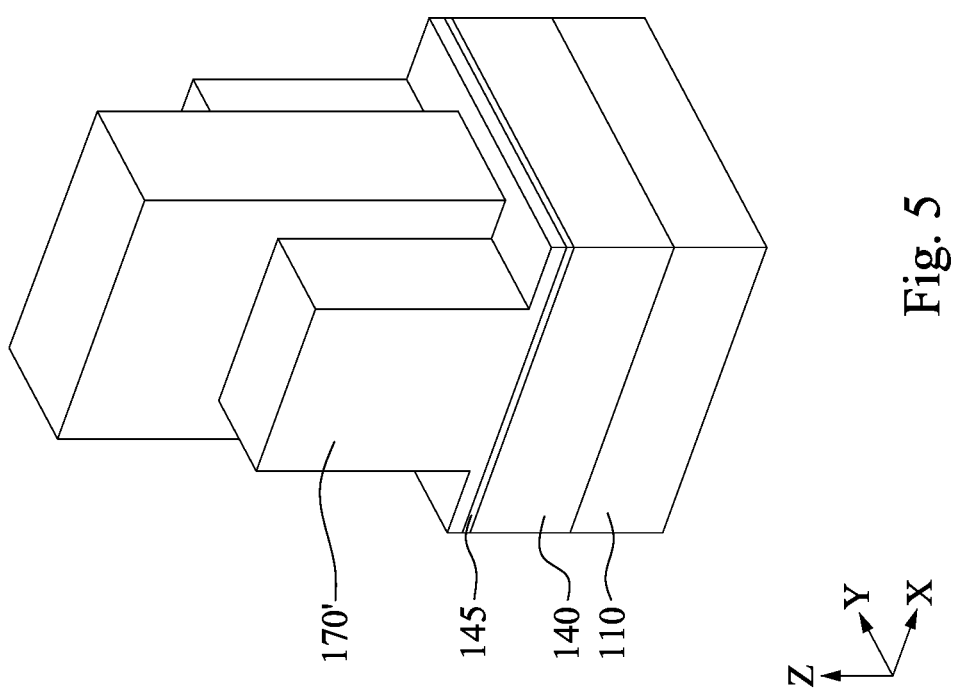

Reference is made to FIG. 5. After formation of the dummy gate structure 150 is completed, a gate spacer 170 (see FIG. 6) is formed on sidewalls of the dummy gate structure 150. Specifically, as shown in FIG. 5, a dielectric film 170' is deposited on the structure as illustrated in FIG. 4. The dielectric film 170' may be silicon nitride (SiN), silicon carbonoxide (SiCO), silicon carbonnitride (SiCN), silicon oxycarbonnitride (SiOCN), or the like. The dielectric film 170' is conformally formed on the substrate 110, the dummy gate structure 150, dummy gate dielectric layer 145, and the fin structure 121. In some embodiments, the dielectric film 170' may be a single layer or multiple layers.

Figure 6:
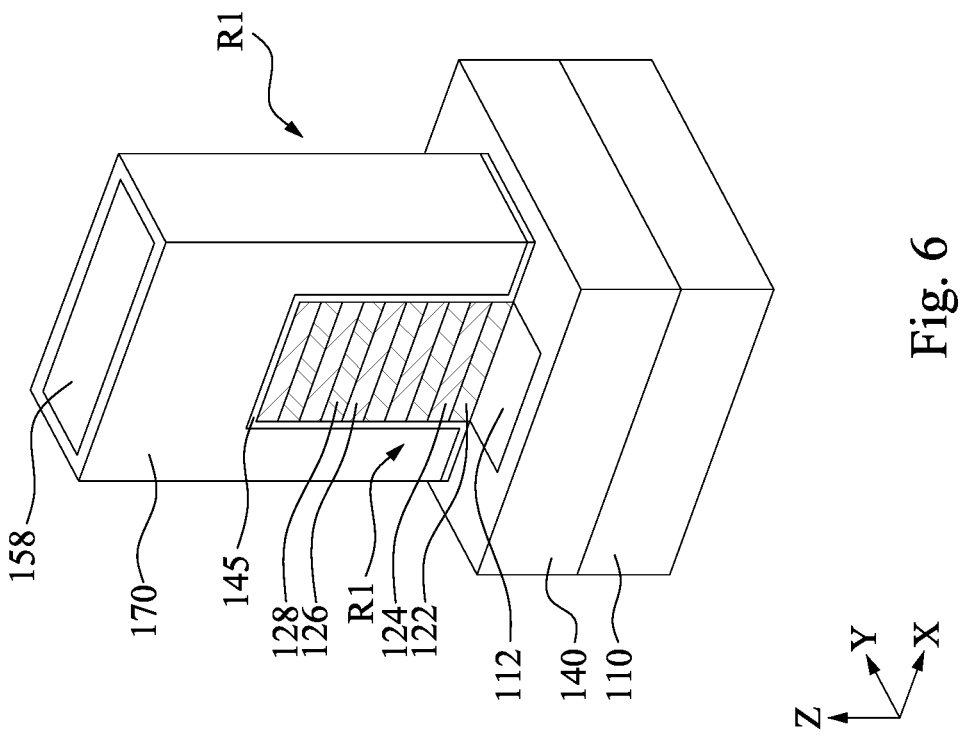

Reference is made to FIG. 6. An anisotropic etching process is then performed on the deposited dielectric film 170' (see FIG. 5) and the dummy gate dielectric layer 145 to expose portions of the fin structure 121 (see FIG. 3) not covered by the dummy gate structure 150 (e.g., in source/drain regions of the fin structure 121). Portions of the dielectric materials directly above the dummy gate structure 150 may be completely removed by this anisotropic etching process. Portions of the dielectric materials on sidewalls of the dummy gate structure 150 may remain, forming gate sidewall spacers, which are denoted as the gate spacer 170, for the sake of simplicity.

The anisotropic etching process further etches exposed portions of the fin structure 121 that extend laterally beyond the gate spacer 170 (e.g., in the source/drain regions of the fin structure 121), resulting in recesses R1 into the fin structure 121 and on opposite sides of the dummy gate structure 150. After the anisotropic etching, end surfaces of the epitaxial layers 122, 124, 126, and 128 are substantially aligned with respective outermost sidewalls of the gate spacer 170, due to the anisotropic etching.

In some embodiments, the anisotropic etching may be performed by a dry chemical etch with a plasma source and a reaction gas. The plasma source may be an inductively coupled plasma (ICP) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 7B:
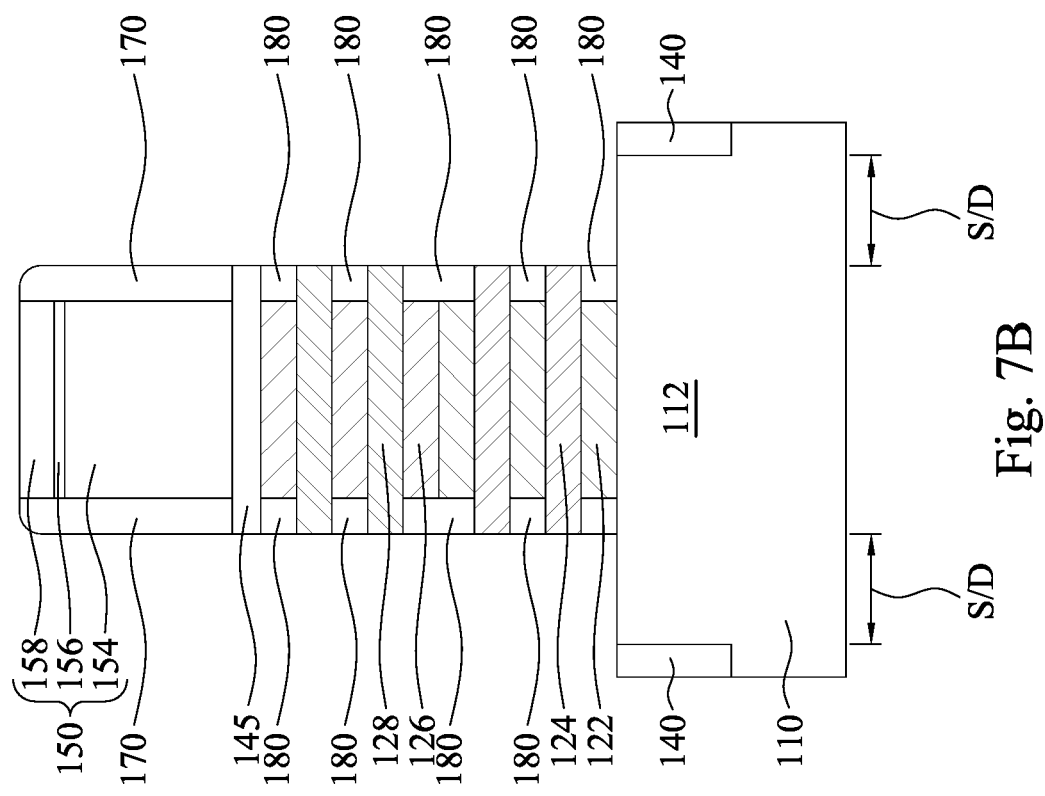
Figure 7A:
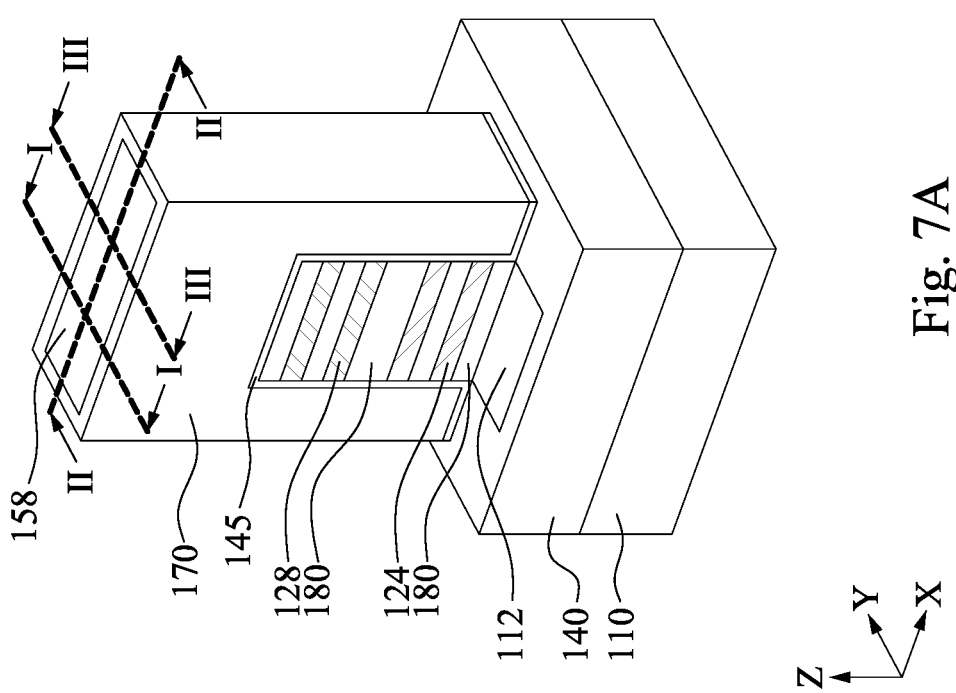
Figure 7C:
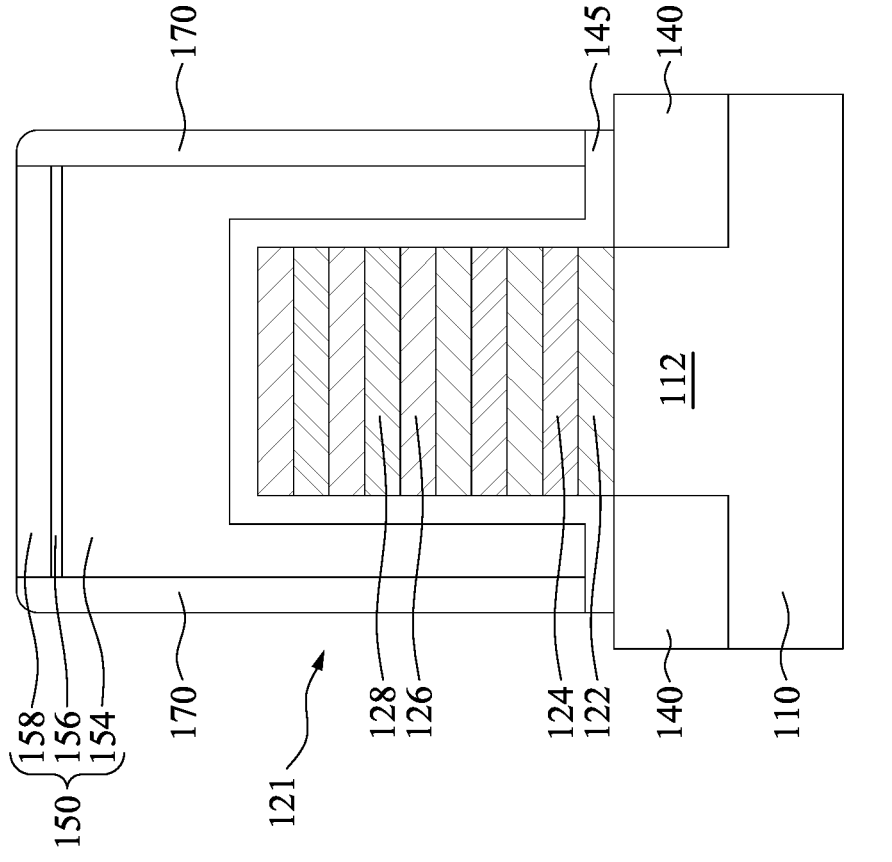

Reference is made to FIGS. 7A-7C. The epitaxial layers 122 and 126 are laterally or horizontally recessed by using suitable etch techniques, resulting in lateral recesses each vertically between corresponding epitaxial layers 124 and 128. This operation may be performed by using a selective wet etching process. By way of example and not limitation, the epitaxial layers 122, 124, 126, and 128 are made of different materials allowing for the selective etching of the epitaxial layers 122 and 126. In some embodiments, the selective wet etching includes an APM etch (e.g., ammonia hydroxide-hydrogen peroxide-water mixture) that etches SiGe (e.g., the epitaxial layers 122 and 124) at a faster etch rate than it etches Si (e.g., the epitaxial layers 126). The selective wet etching may further include a fluorine-containing etchant (e.g., $NF_3$ or other suitable etchant) to etches Ge (e.g., the epitaxial layers 122 and 124) at a faster etch rate than it etches GeSn (e.g., the epitaxial layers 128). Specifically, the fluorine-containing etchant reacts with Sn to form $SnF_x$, which protects GeSn from being further etched. As a result, the epitaxial layers 124 and 128 laterally extend past opposite end surfaces of the epitaxial layers 122 and 124.

Inner spacers 180 are then formed in the recesses. For example, an inner spacer material layer is formed to fill the recesses left by the lateral etching of the epitaxial layers 122 and 126. The inner spacer material layer may be a low-k dielectric material, such as $SiO_2$, silicon nitride (SiN), silicon carbonoxide (SiCO), silicon carbonnitride (SiCN), silicon oxycarbonnitride (SiOCN). The inner spacer material layer can be formed using CVD, including LPCVD and PECVD, PVD, ALD, or other suitable processes. After the deposition of the inner spacer material layer, an anisotropic etching process is performed to trim the deposited inner spacer material layer, such that portions of the deposited inner spacer material layer that fill the recesses left by the lateral etching of the epitaxial layers 122 and 126 are left. After the trimming process, the remaining portions of the deposited inner spacer material are denoted as the inner spacers 180 for the sake of simplicity. The inner spacers 180 serve to isolate metal gates from source/drain epitaxial structures formed in subsequent processing. In the example of FIG. 7B, sidewalls of the inner spacers 180 are substantially aligned with sidewalls of the channel layers 124 and 128.

Figures 8A, 8B:
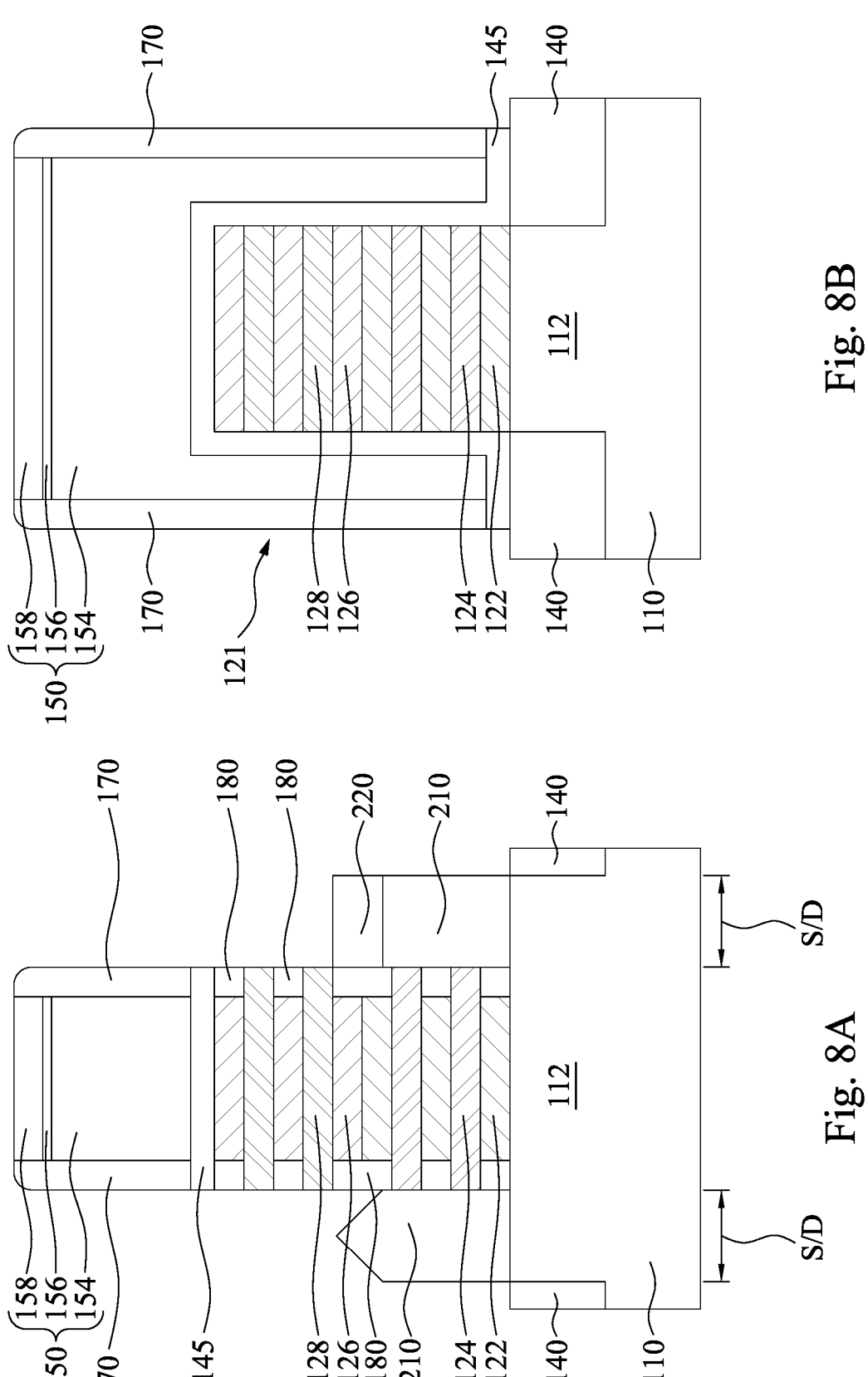

Reference is made to FIGS. 8A and 8B. Source/drain epitaxial structures 210 are formed at the source/drain regions S/D of the fin structure 121. The source/drain epitaxial structures 210 are connected to the epitaxial layers 124. The source/drain epitaxial structures 210 may be formed by performing an epitaxial growth process that provides an epitaxial material connected to the fin structure 121. During the epitaxial growth process, the dummy gate structure 150 and the gate spacer 170 limit the source/drain epitaxial structures 210 to the source/drain regions S/D. In some embodiments, the lattice constants of the source/drain epitaxial structures 210 are different from the lattice constant of the epitaxial layers 124, so that the epitaxial layers 124 can be strained or stressed by the source/drain epitaxial structures 210 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the epitaxial layers 124.

In some embodiments, the source/drain epitaxial structures 210 are silicon-rich materials and may include Si, SiP, or other suitable material. The source/drain epitaxial structures 210 may be in-situ doped during the epitaxial process by introducing doping species including: n-type dopants, such as phosphorus or arsenic; and/or other suitable dopants including combinations thereof. If the source/drain epitaxial structures 210 are not in-situ doped, an implantation process (i.e., a junction implant process) is performed to dope the source/drain epitaxial structures 210. In some exemplary embodiments, the source/drain epitaxial structures 210 in an n-type include Si:P.

As mentioned above, the source/drain epitaxial structures 210 are silicon-rich materials, such that the source/drain epitaxial structures 210 are prone to grow on silicon-rich materials (e.g., the epitaxial layers 124 in this case). Therefore, the source/drain epitaxial structures 210 grow on the epitaxial layers 124 in a rate faster than that grow on the epitaxial layers 128. Even there are some epitaxial materials grown on the epitaxial layers 128 during the growth of the source/drain epitaxial structures 210, the qualities of the epitaxial materials are not good as the source/drain epitaxial structures 210, and the epitaxial materials may peel from the epitaxial layers 128.

An isolation layer 220 is then formed to cover one of the source/drain epitaxial structures 210. Specifically, a dielectric layer is formed over the source/drain epitaxial structures 210, and one or more etching process(es) is/are performed to pattern the dielectric layer to form the isolation layer 220. Therefore, the isolation layer 220 covers one of the source/drain epitaxial structures 210 and is spaced apart from another one of the source/drain epitaxial structures 210. In some embodiments, the isolation layer 220 is made of silicon oxide, silicon nitride, SiOCN, combination thereof, or the like.

Figures 9A, 9B:
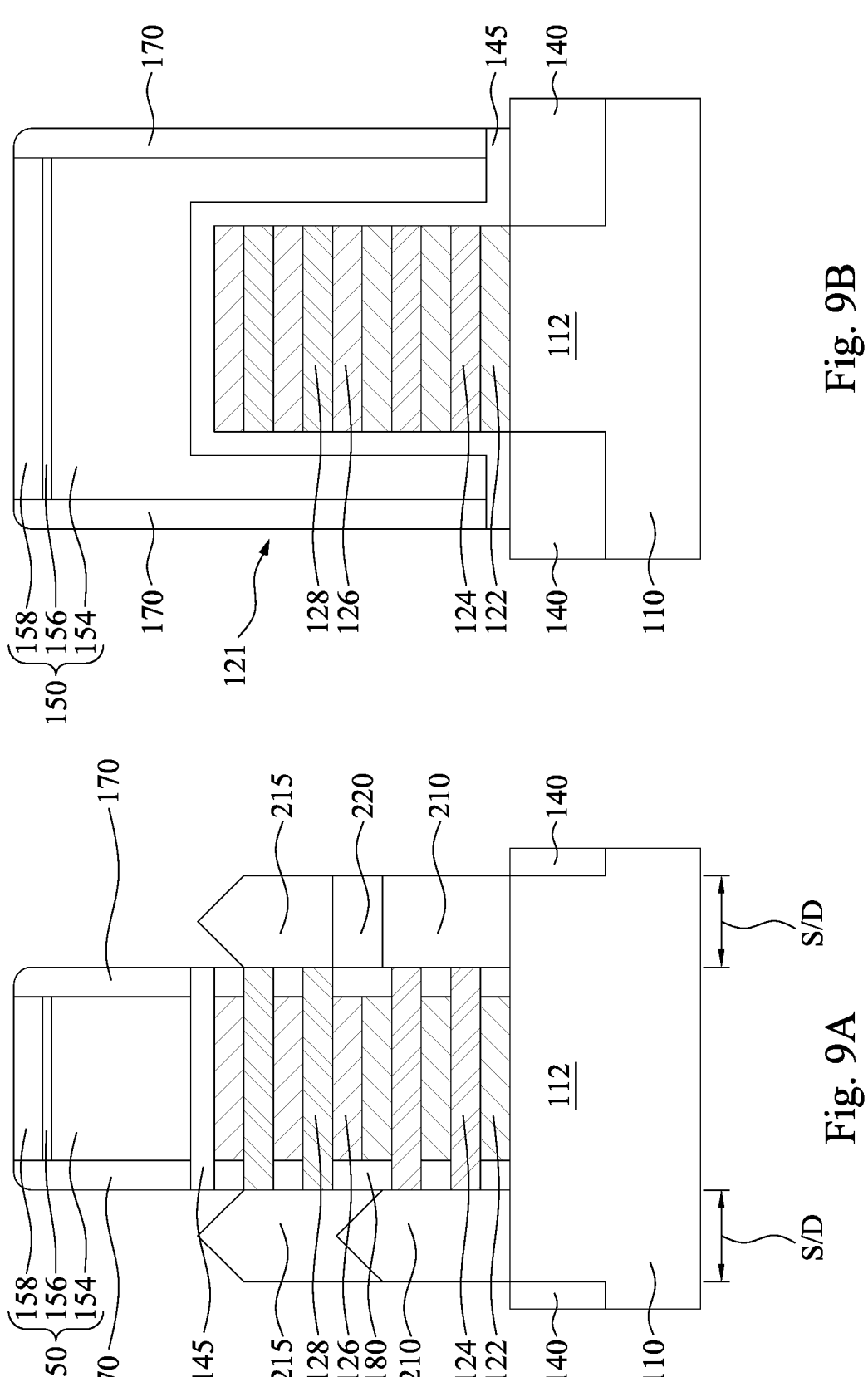

Reference is made to FIGS. 9A and 9B. Source/drain epitaxial structures 215 are formed at the source/drain regions S/D of the fin structure 121. The source/drain epitaxial structures 215 are connected to the epitaxial layers 128. The source/drain epitaxial structures 215 may be formed by performing an epitaxial growth process that provides an epitaxial material connected to the fin structure 121. During the epitaxial growth process, the dummy gate structure 150 and the gate spacer 170 limit the source/drain epitaxial structures 215 to the source/drain regions S/D. In some embodiments, the lattice constants of the source/drain epitaxial structures 215 are different from the lattice constant of the epitaxial layers 128, so that the epitaxial layers 128 can be strained or stressed by the source/drain epitaxial structures 215 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the epitaxial layers 128.

In some embodiments, the source/drain epitaxial structures 215 are germanium-rich materials and may include Ge, GaAs, AlGaAs, SiGe, or other suitable material. The source/drain epitaxial structures 215 may be in-situ doped during the epitaxial process by introducing doping species including: p-type dopants, such as boron or $BF_2$; and/or other suitable dopants including combinations thereof. If the source/drain epitaxial structures 215 are not in-situ doped, an implantation process (i.e., a junction implant process) is performed to dope the source/drain epitaxial structures 215. In some exemplary embodiments, the source/drain epitaxial structures 215 in an n-type include SiGe:B.

As mentioned above, the source/drain epitaxial structures 215 are germanium-rich materials, such that the source/drain epitaxial structures 215 are prone to grow on germanium-rich materials (e.g., the epitaxial layers 128 in this case). Therefore, the source/drain epitaxial structures 215 grow on the epitaxial layers 128 in a rate faster than that grow on the source/drain epitaxial structures 210.

Figures 10A, 10B:
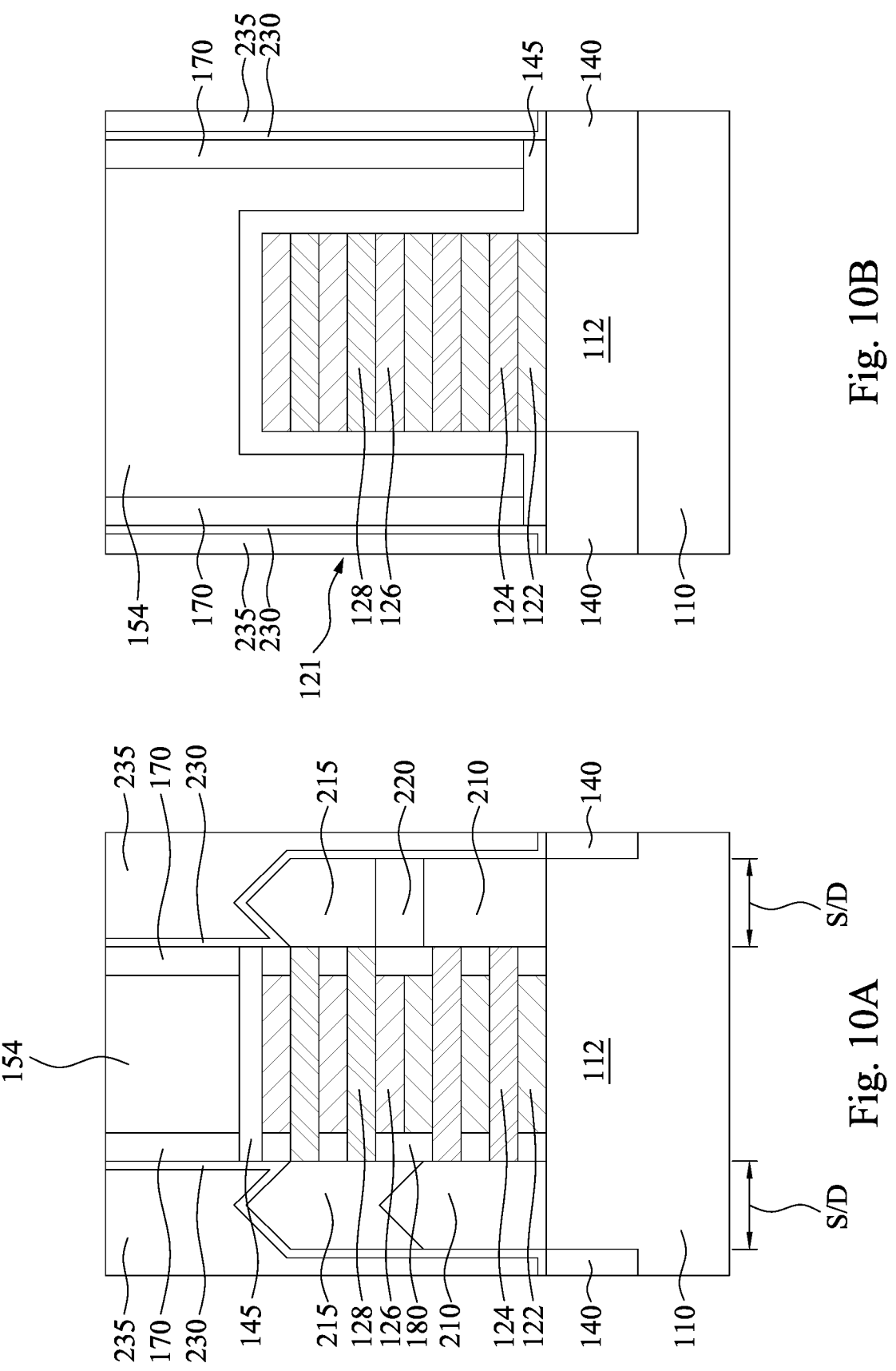

Reference is made to FIGS. 10A and 10B. A contact etch stop layer (CESL) 230 is conformally formed over the substrate 110. In some embodiments, the CESL 230 can be a stressed layer or layers. In some embodiments, the CESL 230 has a tensile stress and is formed of SiN, SiCN, combinations thereof, of the like. In some other embodiments, the CESL 230 includes materials such as oxynitrides. In yet some other embodiments, the CESL 230 may have a composite structure including a plurality of layers, such as a silicon nitride layer overlying a silicon oxide layer. The CESL 230 can be formed using plasma enhanced CVD (PECVD), however, other suitable methods, such as low-pressure CVD (LPCVD), atomic layer deposition (ALD), and the like, can also be used.

An interlayer dielectric (ILD) layer 235 is then formed on the CESL 230. The ILD layer 235 may be formed by chemical vapor deposition (CVD), high-density plasma CVD, spin-on, sputtering, or other suitable methods. In some embodiments, the ILD layer 235 includes silicon oxide. In some other embodiments, the ILD layer 235 may include silicon oxy-nitride, silicon nitride, SiOCN, compounds including Si, O, C and/or H (e.g., silicon oxide, SiCOH and SiOC), a low-k material, or organic materials (e.g., polymers). After the ILD layer 235 is formed, a planarization operation, such as CMP, is performed, so that the patterned hard masks 156 and 158 (see FIGS. 9A and 9B) are removed and the dummy gate electrode layer 154 is exposed.

Figure 11B:
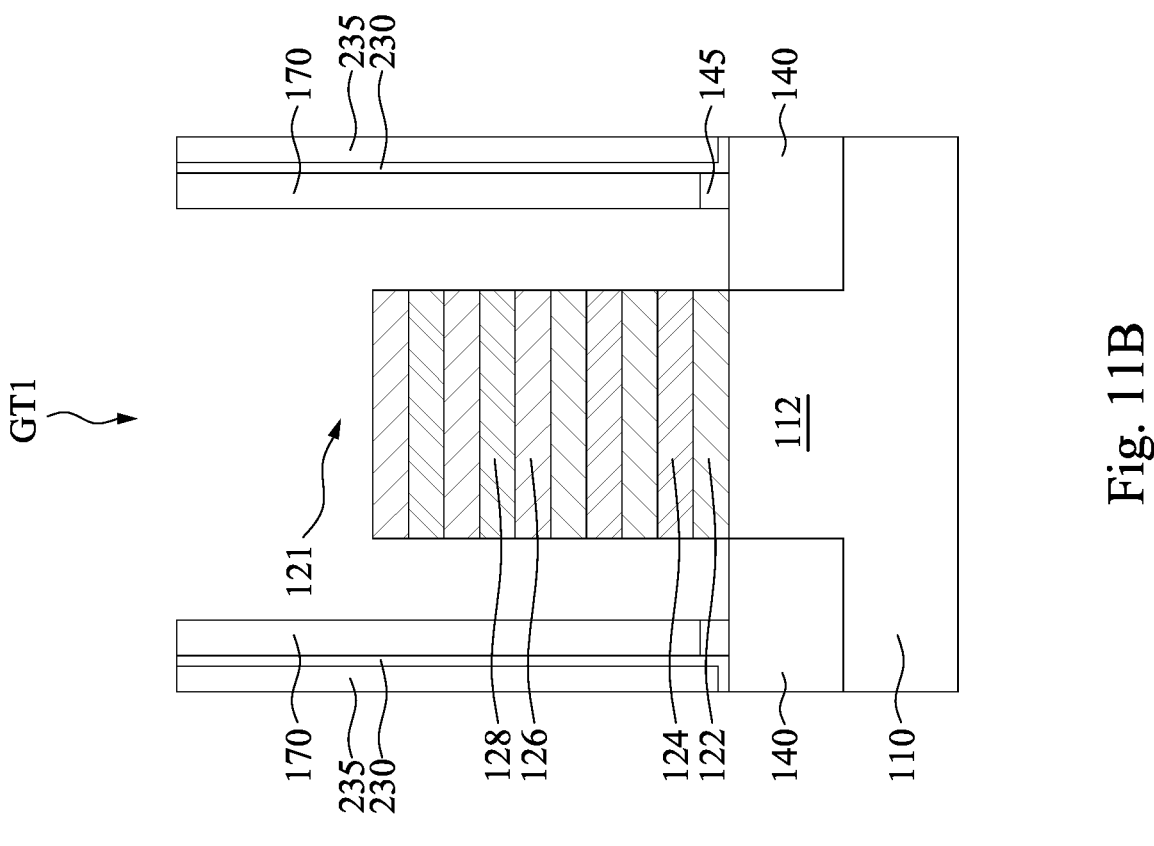
Figure 11A:
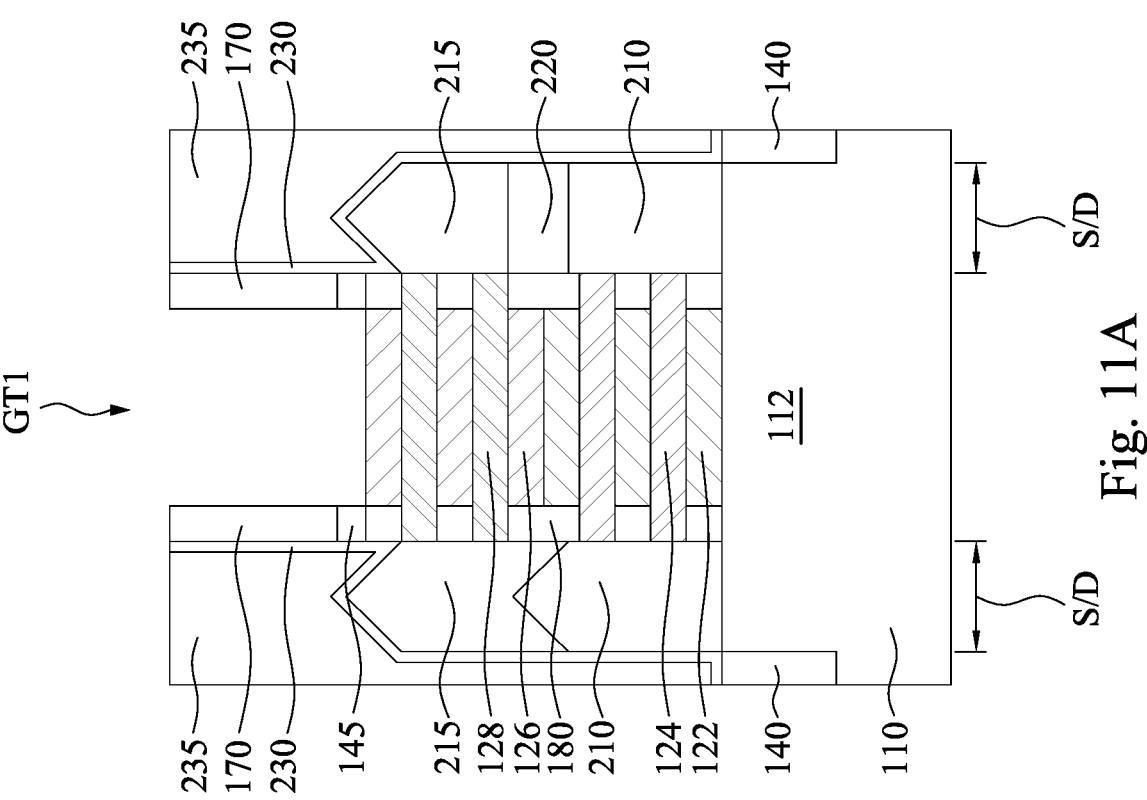

Reference is made to FIGS. 11A and 11B. The dummy gate electrode layer 154 and the dummy gate dielectric layer 145 (see FIGS. 10A and 10B) are removed, thereby exposing the epitaxial layers 122, 124, 126, and 128. The ILD layer 235 protects the source/drain epitaxial structures 210 and 215 during the removal of the dummy gate electrode layer 164 and the dummy gate dielectric layer 145. In some embodiments, the dummy gate electrode layer 154 and the dummy gate dielectric layer 145 are removed by using a selective etching process (e.g., selective dry etching, selective wet etching, or combinations thereof) that etches the materials in dummy gate electrode layer 154 and the dummy gate dielectric layer 145 at a faster etch rate than it etches other materials (e.g., the gate spacers 170 and/or the ILD layer 235), thus resulting in gate trench GT1 between corresponding gate spacers 170, with the epitaxial layers 122, 124, 126, and 128 exposed in the gate trench GT1.

Figure 12B:
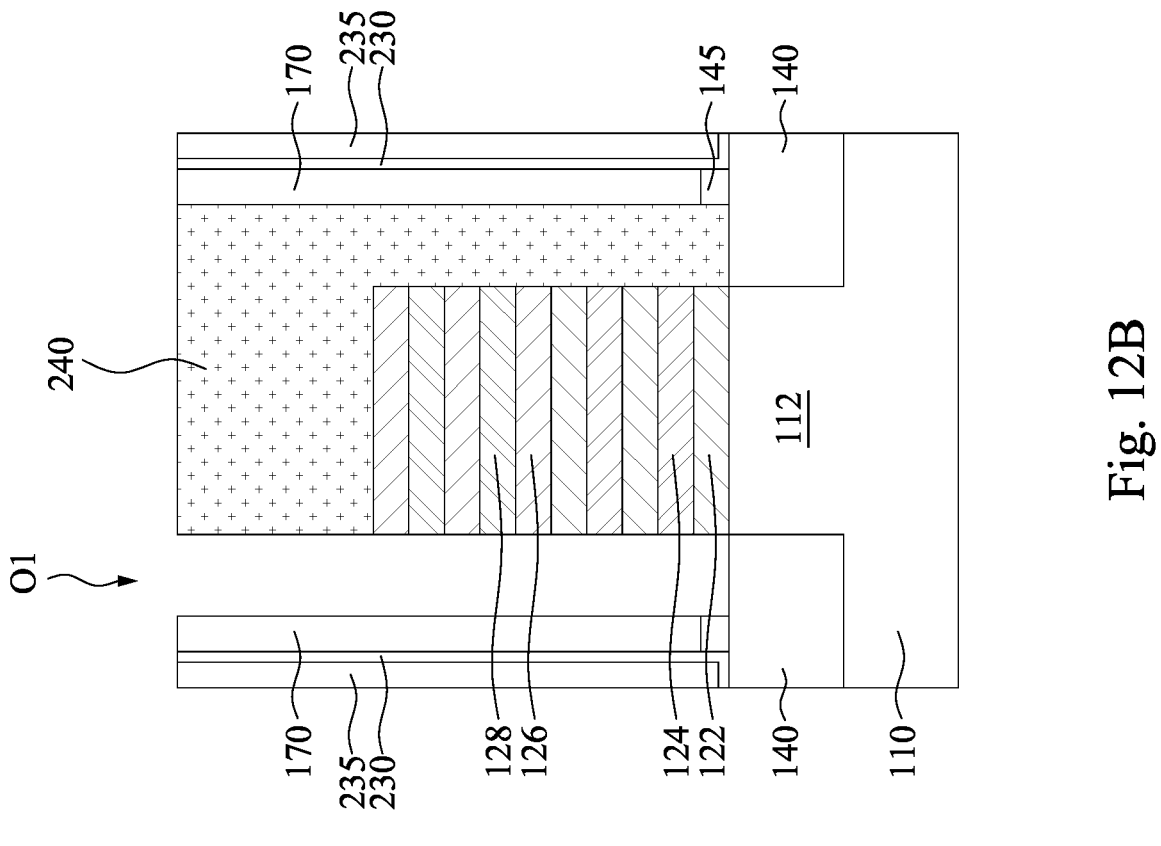
Figure 12A:
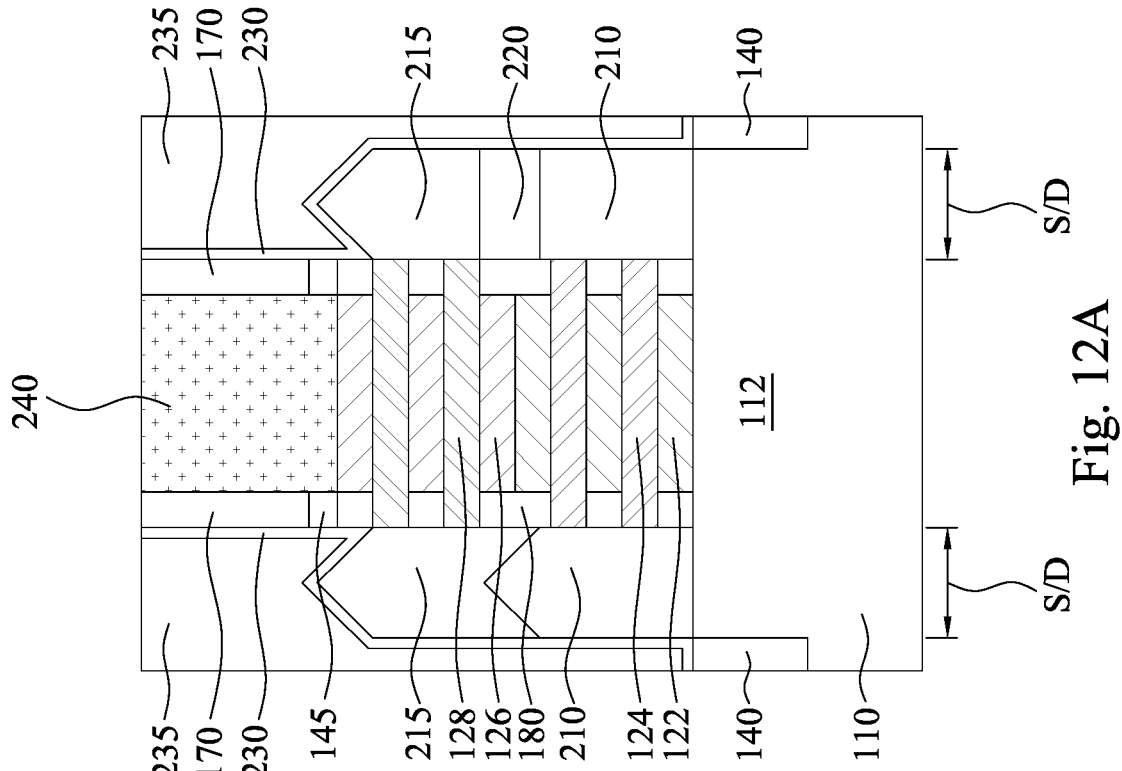

Reference is made to FIGS. 12A and 12B. Subsequently, a protection material 240 is filled in the gate trench GT1, and a planarization process (e.g., a CMP process) is performed to level a top surface of the protection material 240 with a top surface of the ILD layer 235. In some embodiments, the protection material 240 is made of silicon nitride (SiN), silicon carbonoxide (SiOC), silicon carbonnitride (SiCN), silicon oxycarbonnitride (SiOCN), or the like. The protection material 240 includes a material different from the ILD 235 and the gate spacer 170 to create etch selectivity in the following etching processes (e.g., the etching processes as shown in FIGS. 12B, 15A-15B, 17A-17B, and 19A-19B).

Subsequently, an opening O1 is formed in the protection material 240 to expose first side surfaces of the epitaxial layers 122, 124, 126, and 128. The protection material 240 still covers second side surfaces, which are opposite to the first side surfaces, of the epitaxial layers 122, 124, 126, and 128. Further, the opening O1 exposes a portion of an inner sidewall of the gate spacer 170. The opening O1 is formed using a selective etching process (e.g., selective dry etching, selective wet etching, or combinations thereof) that etches materials in the protection material 240 at a faster etch rate than it etches other materials (e.g., the gate spacer 170, the CESL 230, the ILD layer 235, and/or the epitaxial layers 122, 124, 126, and 128).

Figure 13B:
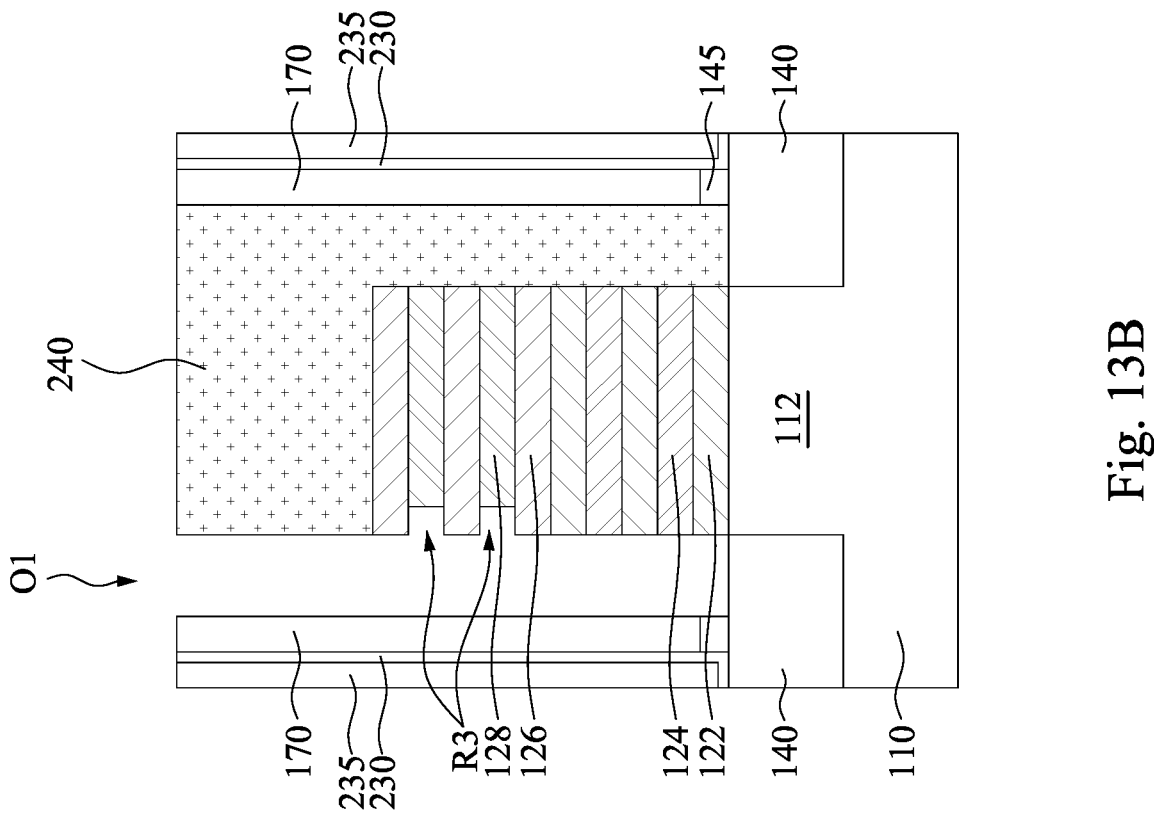
Figure 13A:
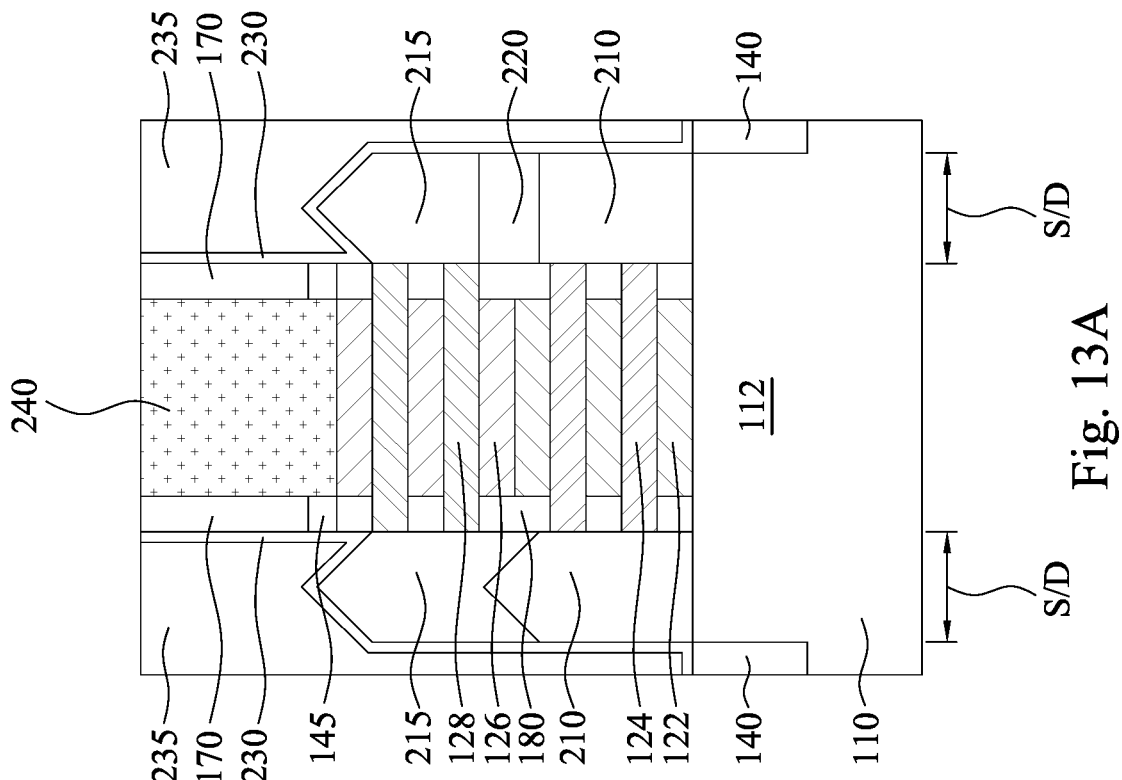

Reference is made to FIGS. 13A and 13B. The epitaxial layers 128 are laterally or horizontally recessed by using suitable etch techniques, resulting in lateral recesses R3 each vertically between corresponding epitaxial layers 126. This operation may be performed by using a selective etching process. By way of example and not limitation, the ILD layer 235 and the gate spacer 170 are dielectric materials, and the epitaxial layers 122, 124, and 126 are semiconductor materials that have different compositions and/or concentrations from the epitaxial layers 128 allowing for the selective etching of the epitaxial layers 128. The selective etching may include peroxide-water etchant to etches Ge (e.g., the epitaxial layers 128) at a faster etch rate than it etches Si (e.g., the epitaxial layers 122, 124, and 126). As a result, the epitaxial layers 122, 124, and 126 laterally extend past the first side surfaces of the epitaxial layers 128.

Figure 14B:
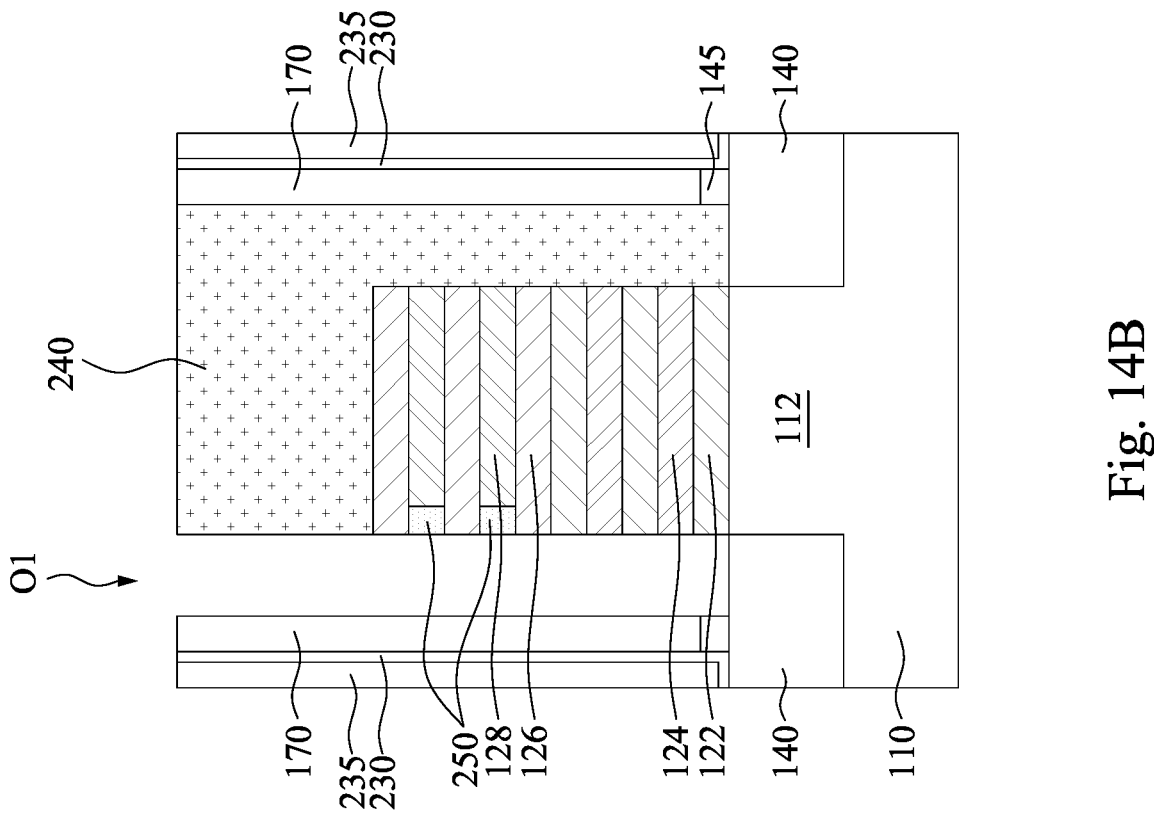
Figure 14A:
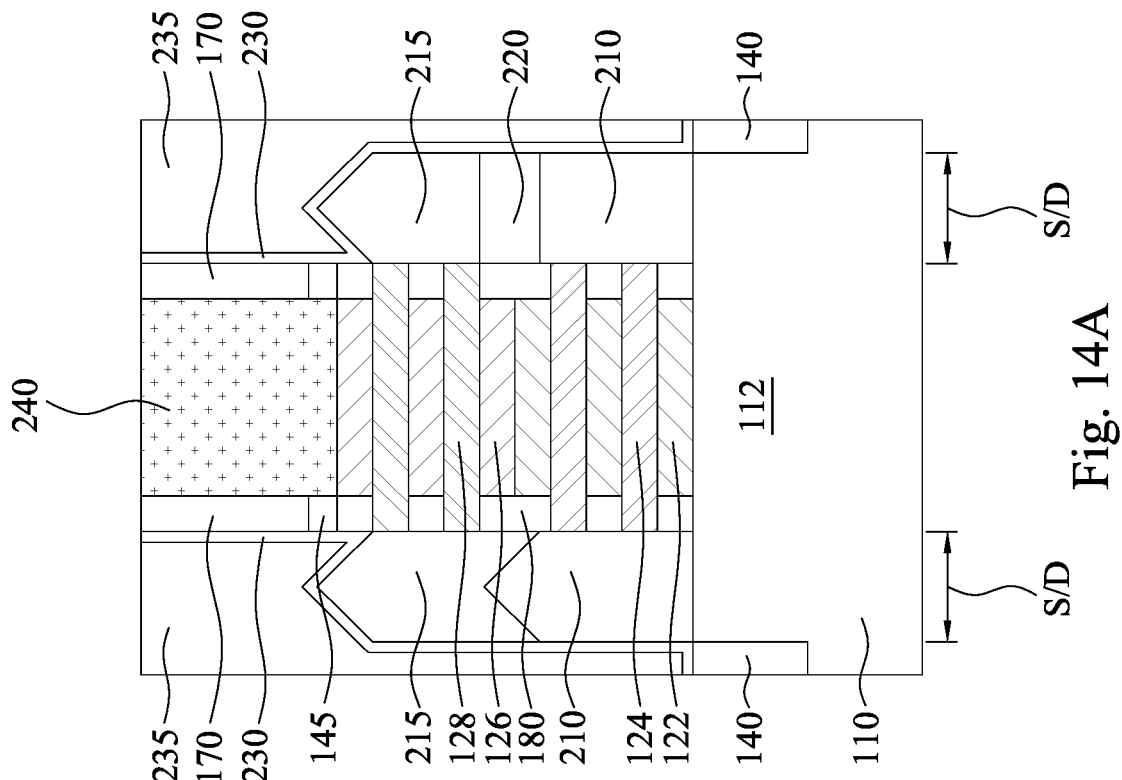

Reference is made to FIGS. 14A and 14B. Dielectric blocking layers 250 are filled in the recesses R3 (see FIG. 13B), respectively. For example, dielectric material layers are formed to fill the recesses R3 left by the lateral etching of the epitaxial layers 128 discussed above with reference to FIGS. 13A and 13B. The dielectric material layer may be a low-k dielectric material, such as $SiO_2$, SIN, SiC, SiON, SiCN, SiOCN, SiBCN, combinations thereof, or the like, and may be formed by a suitable deposition method, such as ALD. The dielectric material layer may be formed using CVD, including LPCVD and PECVD, PVD, ALD, or other suitable processes, alternatively.

After the deposition of the dielectric material layer, an anisotropic etching process may be performed to trim the deposited dielectric material layer, such that portions of the deposited dielectric material layer that fill the recesses R3 left by the lateral etching of the epitaxial layers 128 are left. After the trimming process, the remaining portions of the deposited dielectric material are denoted as dielectric blocking layers 250 in the recesses R3, for the sake of simplicity. The dielectric blocking layers 250 serve to seal the epitaxial layers 128 during the removal of epitaxial layers 122 (see FIGS. 15A and 15B) and the formation of gate structure (see FIGS. 16A and 16B).

Figure 15B:
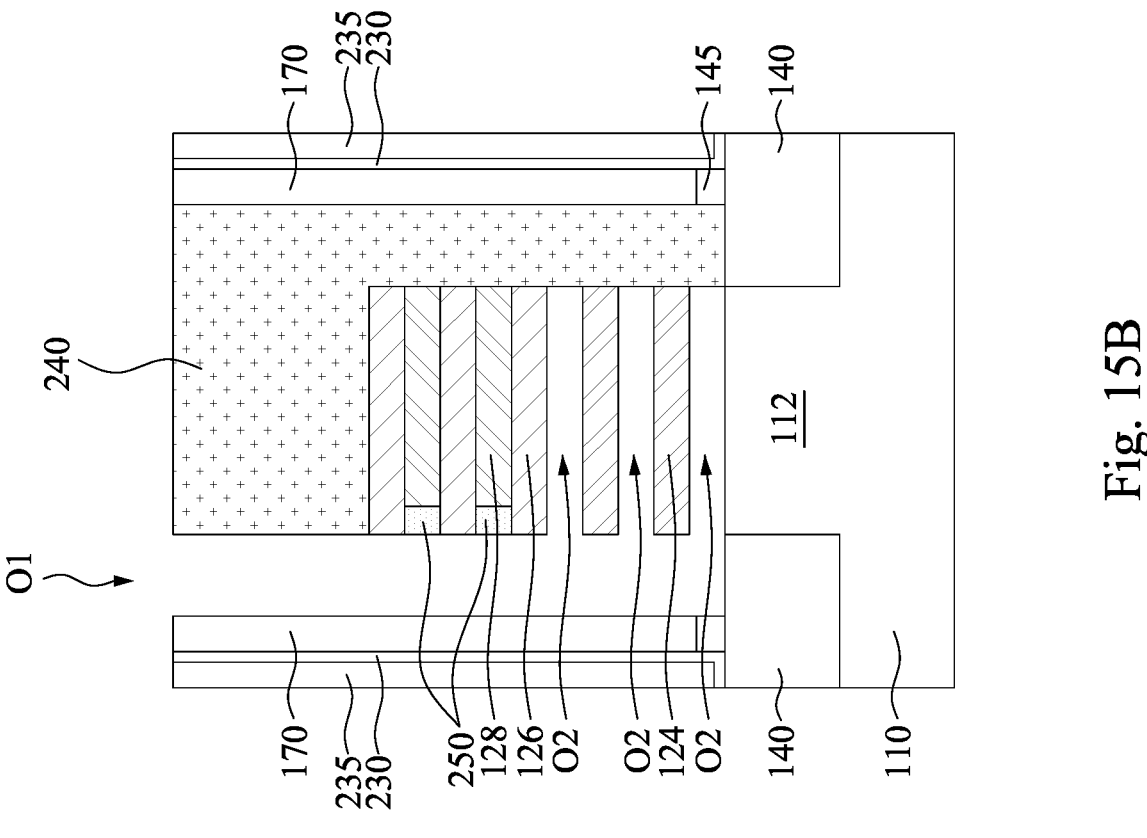
Figure 15A:
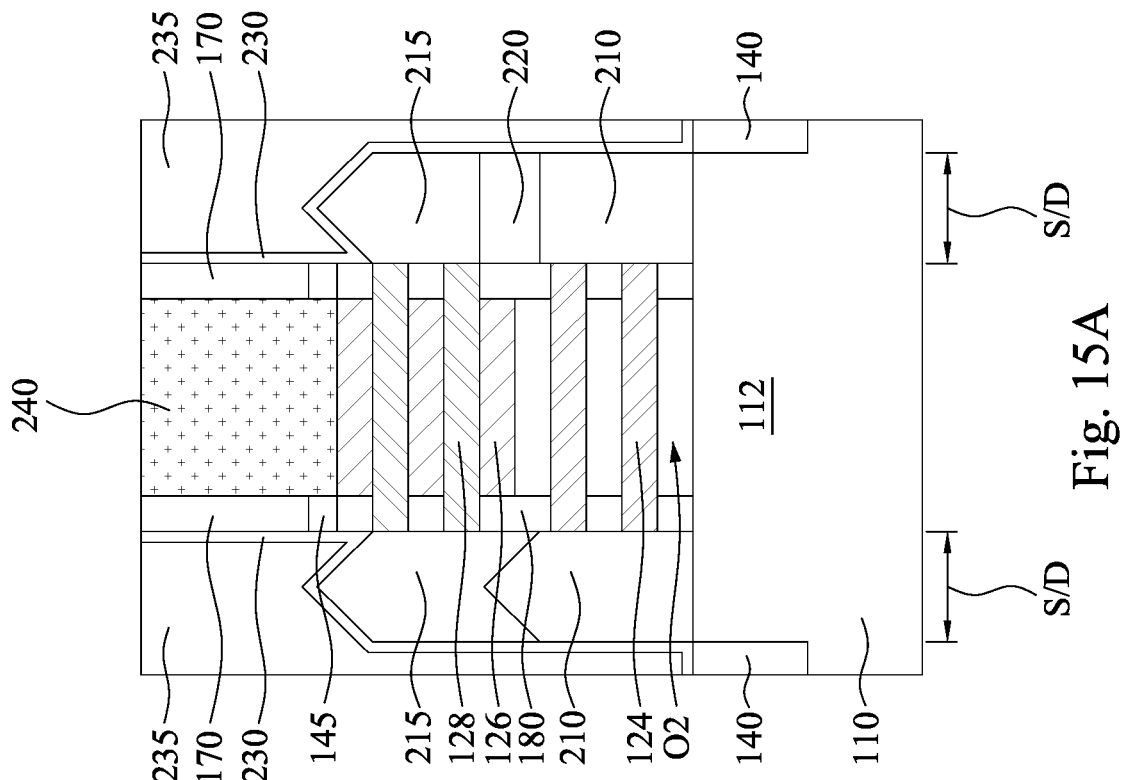

Reference is made to FIGS. 15A and 15B. Subsequently, the epitaxial layers 122 (see FIGS. 14A and 14B) exposed by the opening O1 are removed by using another selective etching process that etches the epitaxial layers 122 at a faster etch rate than it etches the epitaxial layers 124 and 126, thus forming openings O2 between neighboring epitaxial layers (i.e., channel layers) 124/126. The selective etching may include peroxide-water etchant to etches Ge (e.g., the epitaxial layers 122) at a faster etch rate than it etches Si (e.g., the epitaxial layers 124 and 126). In this way, the epitaxial layers 124 become fork-sheets suspended over the substrate 110 and between the source/drain epitaxial structures 210. This operation is also called a channel release process. In some embodiments, the epitaxial layers 124 can be interchangeably referred to as nanostructure (fork-sheets, nanowires, nanoslabs and nanorings, nanosheets, etc., depending on their geometry). For example, in some other embodiments the epitaxial layers 124 may be trimmed to have a substantial rounded shape (i.e., cylindrical) (see FIG. 22) due to the selective etching process for completely removing the epitaxial layers 122. In that case, the resultant epitaxial layers 124 can be called nanowires.

Figures 16A, 16B:
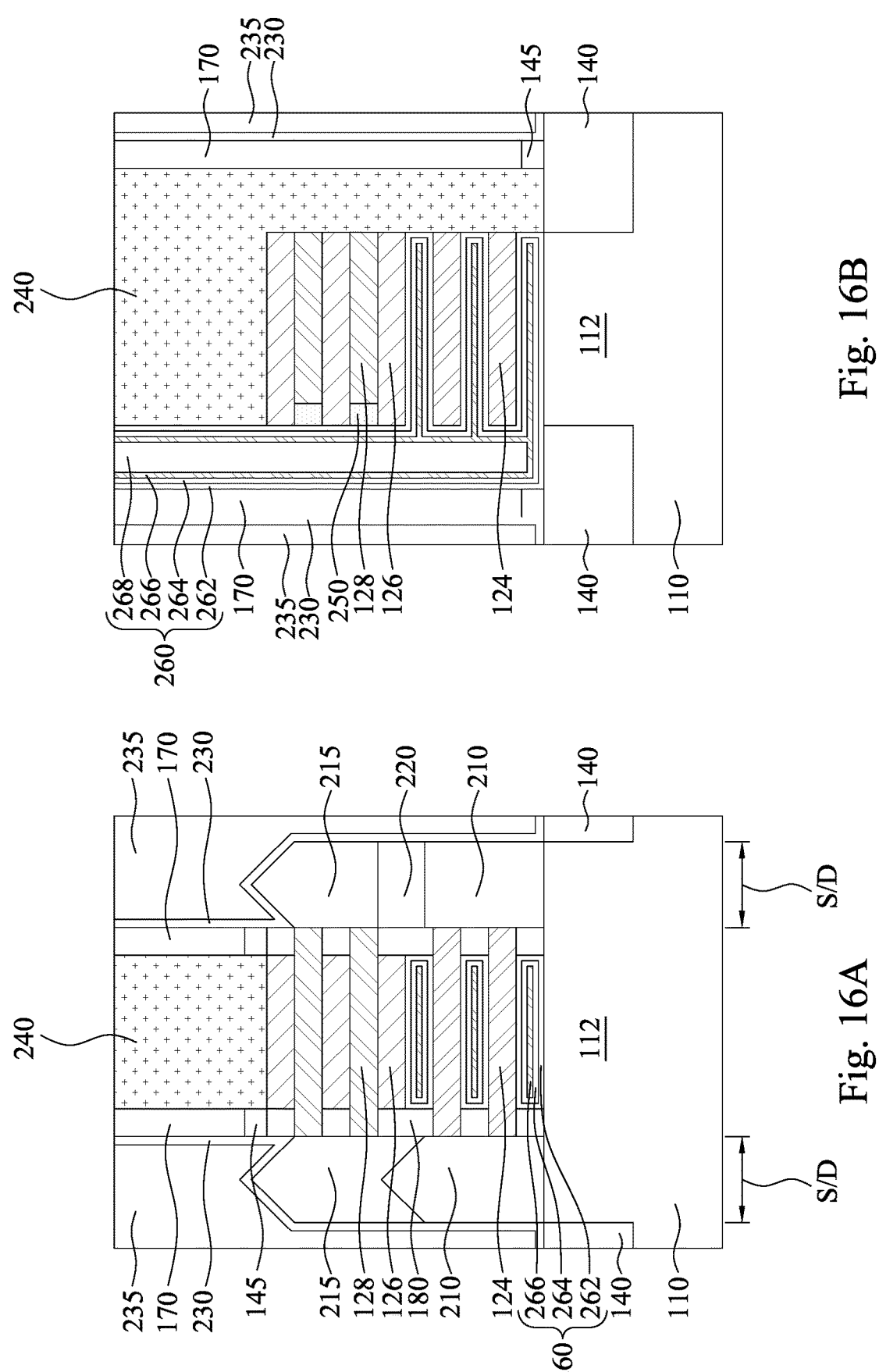

Reference is made to FIGS. 16A and 16B. A gate structure 260 is formed in the openings O1 and O2 (see FIGS. 15A and 15B). Formation of the gate structures 260 may include depositions to form various gate materials, one or more liner layers, and one or more CMP processes to remove excessive gate materials. Specifically, a gate dielectric layer of the gate structure 260 is formed in the openings O1 and O2 and around the epitaxial layers 124. The gate dielectric layer includes an interfacial layer (e.g., silicon oxide layer) 262 and a high-k gate dielectric layer 264 over the interfacial layer 262. High-k gate dielectrics include dielectric materials having a high dielectric constant, for example, greater than that of thermal silicon oxide (~3.9). In some embodiments, the interfacial layer 262 of the gate dielectric layer may include a dielectric material such as silicon oxide ($SiO_2$), HfSiO, silicon oxynitride (SiON), SiBCN, SiOC, SiCN, or combinations thereof. The interfacial layer 262 may be formed by atomic layer deposition (ALD), chemical vapor deposition (CVD), and/or other suitable method. The high-k gate dielectric layer 264 of the gate dielectric layer may include hafnium oxide ($HfO_2$). Alternatively, the high-k gate dielectric layer 264 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (Al- SiO), aluminum oxide ($Al_2O_3$), silicon nitride ($Si_3N_4$), oxynitrides (SiON), PZT. VDF-TrFE (Ferroelectric polymer), and combinations thereof.

A work function metal layer 266 of the gate structure 260 is formed around the high-k gate dielectric layer 264. The work function metal layer 266 may include work function metals to provide a suitable work function for the gate structure 260. For an n-type FET, the work function metal layer 266 may include one or more n-type work function metals (N-metal). The n-type work function metals may exemplarily include, but are not limited to, titanium nitride (TiN), titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials.

A fill metal 268 of the gate structure 260 is formed over the work function metal layer 266 and fills the opening(s) O1 (and O2). In some embodiments, the fill metal 268 may exemplarily include, but are not limited to, tungsten, platinum, aluminum, copper, nickel, cobalt, silver, gold, ruthenium, titanium, tantalum, titanium nitride, tantalum nitride, tungsten nitride, ruthenium oxide, nickel silicide, cobalt silicide, TaC, TaSiN, TaCN, TiAl, TiAlN, or other suitable materials.

Figures 17A, 17B:
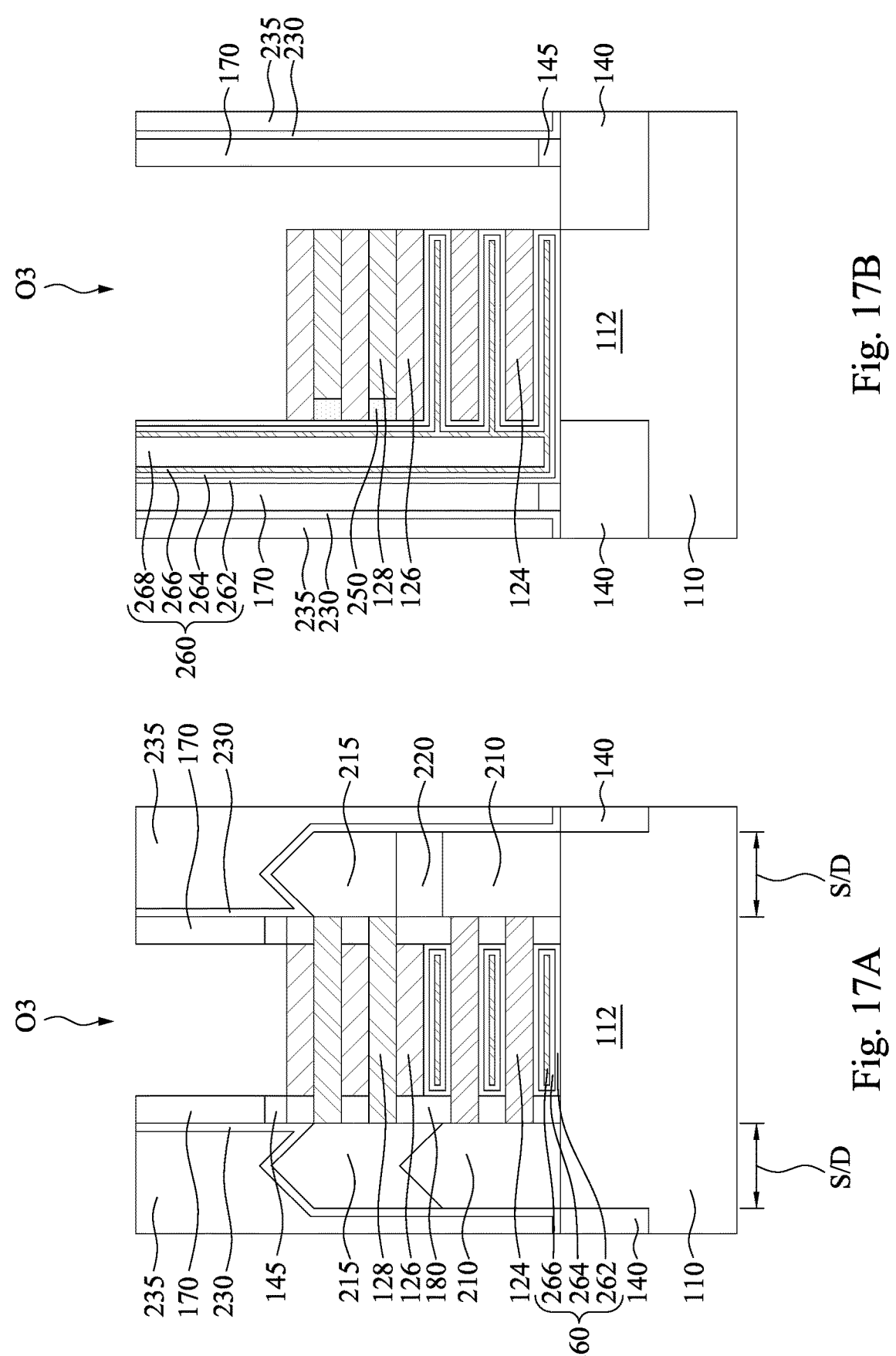

Reference is made to FIGS. 17A and 17B. The protection material 240 (see FIGS. 16A and 16B) is then removed to form another opening O3, which exposes the second side surfaces of the epitaxial layers 122, 124, 126, and 128 while the gate structure 260 and the dielectric blocking layers 250 cover the first side surfaces of the epitaxial layers 122, 124, 126, and 128. Further, the opening O3 exposes another portion of an inner sidewall of the gate spacer 170. The opening O3 is formed using a selective etching process (e.g., selective dry etching, selective wet etching, or combinations thereof) that etches materials in the protection material 240 (see FIGS. 16A and 16B) at a faster etch rate than it etches other materials (e.g., the gate spacer 170, the CESL 230, the ILD layer 235, and/or the epitaxial layers 124, 126, and 128).

Figures 18A, 18B:
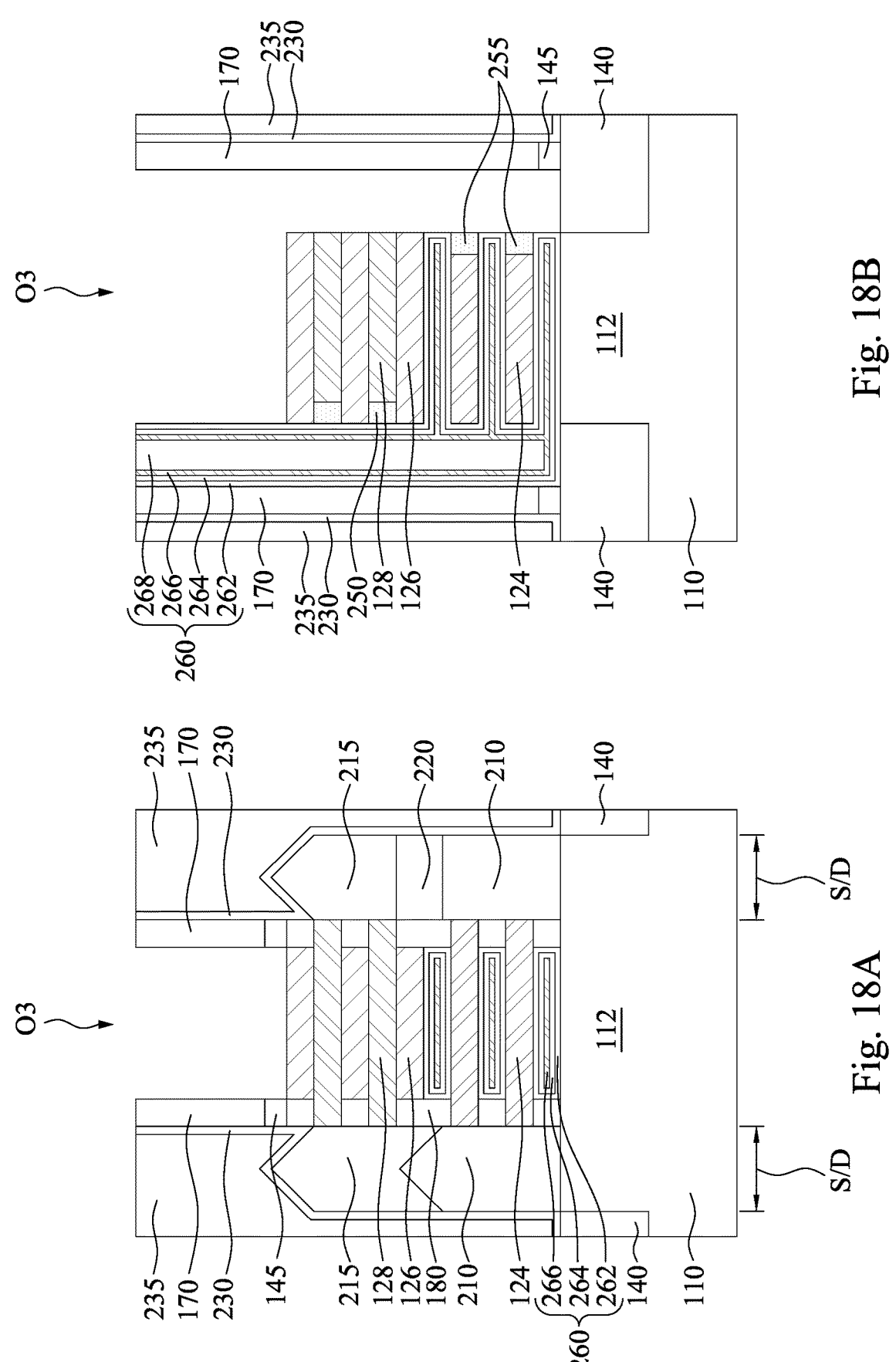

Reference is made to FIGS. 18A and 18B. The epitaxial layers 124 are laterally or horizontally recessed by using suitable etch techniques, resulting in lateral recesses each vertically between corresponding epitaxial layers 122. This operation may be performed by using a selective etching process. By way of example and not limitation, the ILD layer 235, the gate spacer 170, and the interfacial layer 262 of the gate structure 260 are dielectric materials, and the epitaxial layers 126 and 128 are semiconductor materials that have different compositions and/or concentrations from the epitaxial layers 124 allowing for the selective etching of the epitaxial layers 124. The selective etching may include $NH_4OH$ etchant to etches Si (e.g., the epitaxial layers 124) at a faster etch rate than it etches Ge (e.g., the epitaxial layers 126 and 128). As a result, the gate structure 260 laterally extends past the second side surfaces of the epitaxial layers 124.

Dielectric blocking layers 255 are then filled in the recesses, respectively. For example, dielectric material layers are formed to fill the recesses left by the lateral etching of the epitaxial layers 124 discussed above. The dielectric material layer may be a low-k dielectric material, such as $SiO_2$, SiN, SiC, SiON, SiCN, SiOCN, SiBCN, combinations thereof, or the like, and may be formed by a suitable deposition method, such as ALD. The dielectric material layer may be formed using CVD, including LPCVD and PECVD, PVD, ALD, or other suitable processes, alternatively.

After the deposition of the dielectric material layer, an anisotropic etching process may be performed to trim the deposited dielectric material layer, such that portions of the deposited dielectric material layer that fill the recesses left by the lateral etching of the epitaxial layers 124 are left. After the trimming process, the remaining portions of the deposited dielectric material are denoted as dielectric blocking layers 255 in the recesses R4, for the sake of simplicity. The dielectric blocking layers 255 serve to seal the epitaxial layers 124 during the formation of gate structure (see FIGS. 20A and 20B).

Figures 19A, 19B:
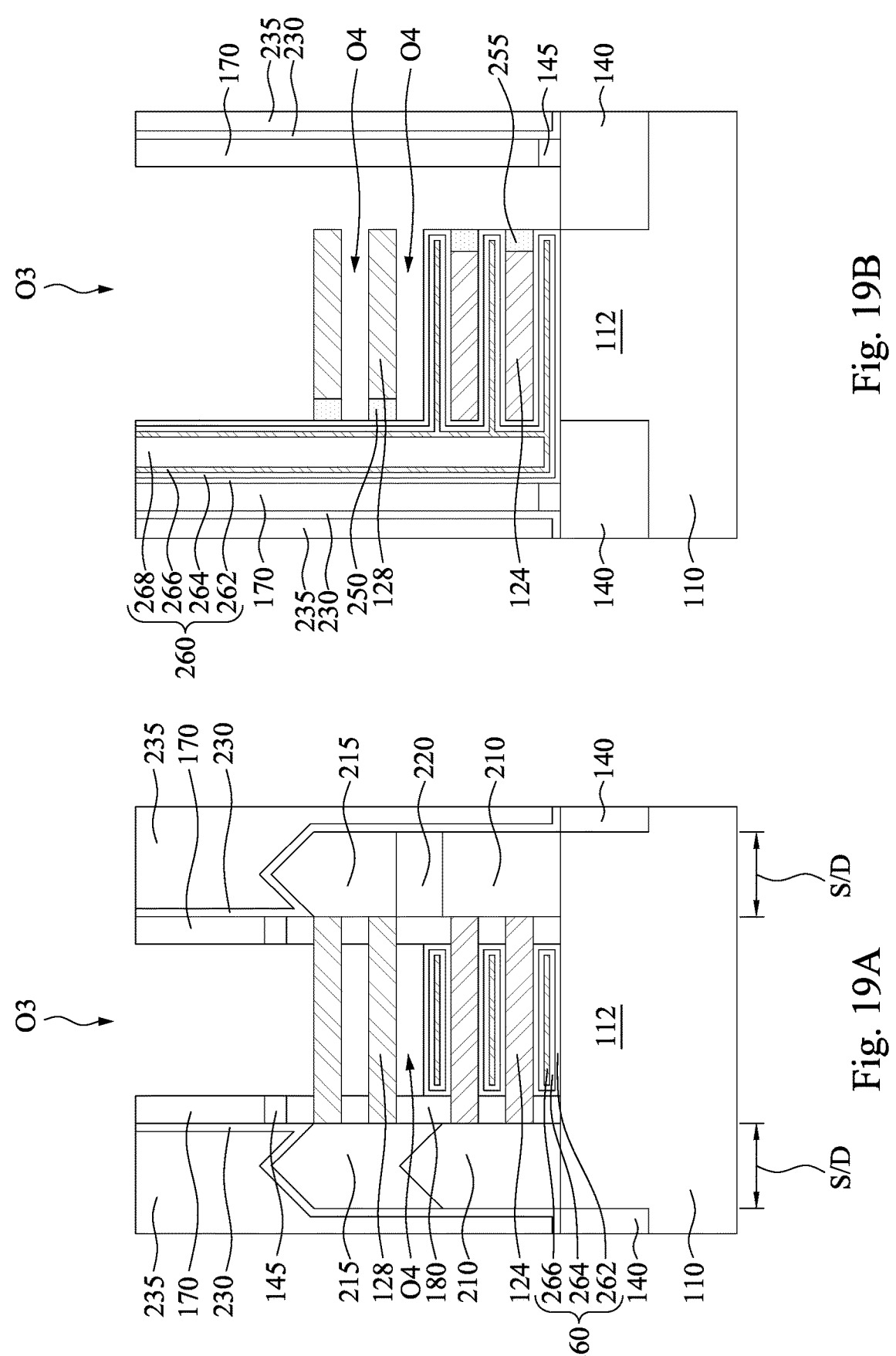

Reference is made to FIGS. 19A and 19B. Subsequently, the epitaxial layers 126 exposed by the opening O3 are removed by using another selective etching process that etches the epitaxial layers 126 at a faster etch rate than it etches the epitaxial layers 128, thus forming openings O4 between neighboring epitaxial layers (i.e., channel layers) 128. The selective etching may include fluorine-containing etchant (e.g., $NF_3$ or other suitable etchant) to etches Ge (e.g., the epitaxial layers 126) at a faster etch rate than it etches Sn (e.g., the epitaxial layers 128). In this way, the epitaxial layers 128 become fork-sheets suspended over the substrate 110 and between the source/drain epitaxial structures 215. This operation is also called a channel release process. In some embodiments, the epitaxial layers 128 can be interchangeably referred to as nanostructure (fork-sheets, nanowires, nanoslabs and nanorings, nanosheets, etc., depending on their geometry). For example, in some other embodiments the epitaxial layers 128 may be trimmed to have a substantial rounded shape (i.e., cylindrical) (see FIG. 22) due to the selective etching process for completely removing the epitaxial layers 126. In that case, the resultant epitaxial layers 128 can be called nanowires.

Figures 20A, 20B:
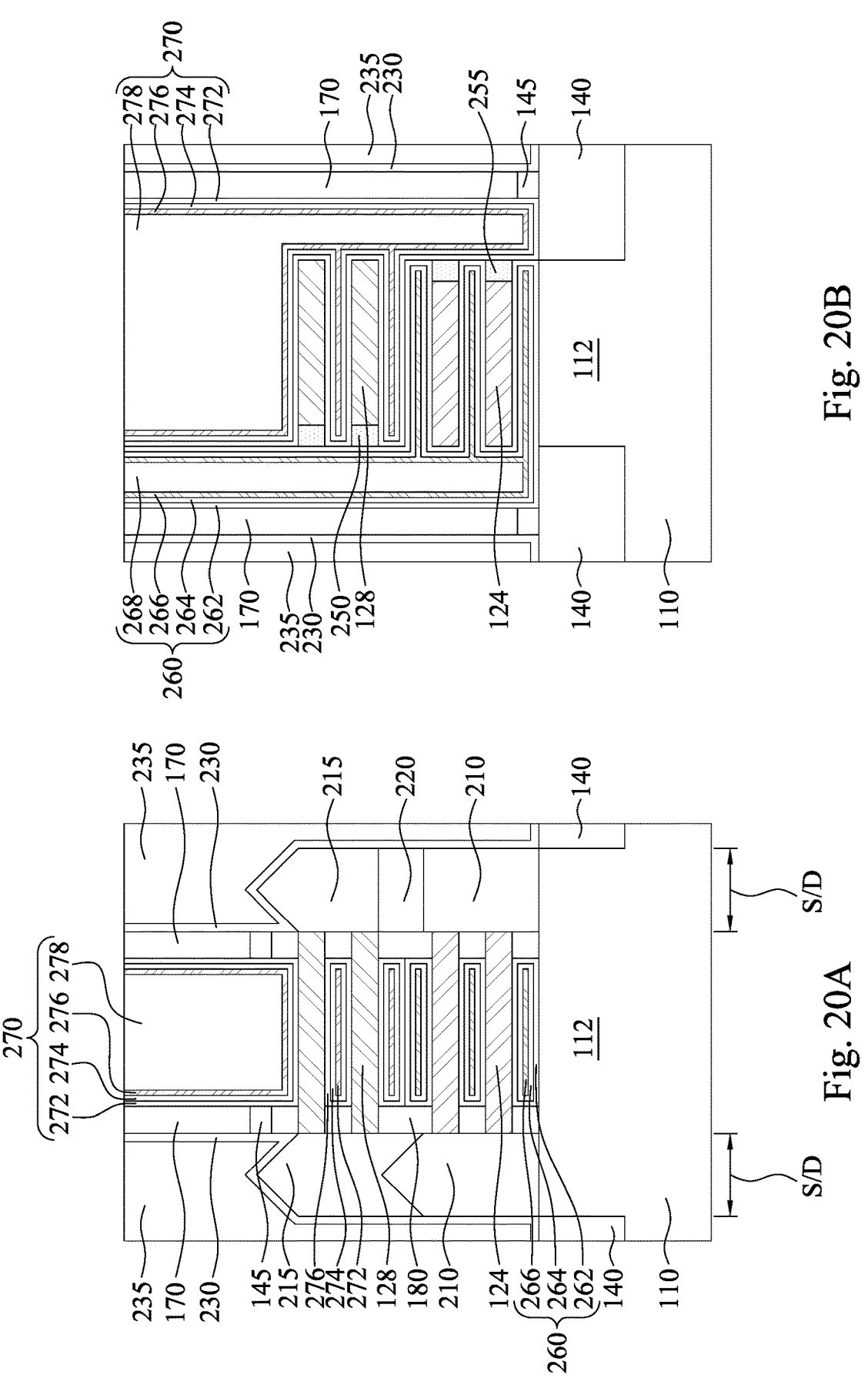
Figures 21A, 21B:
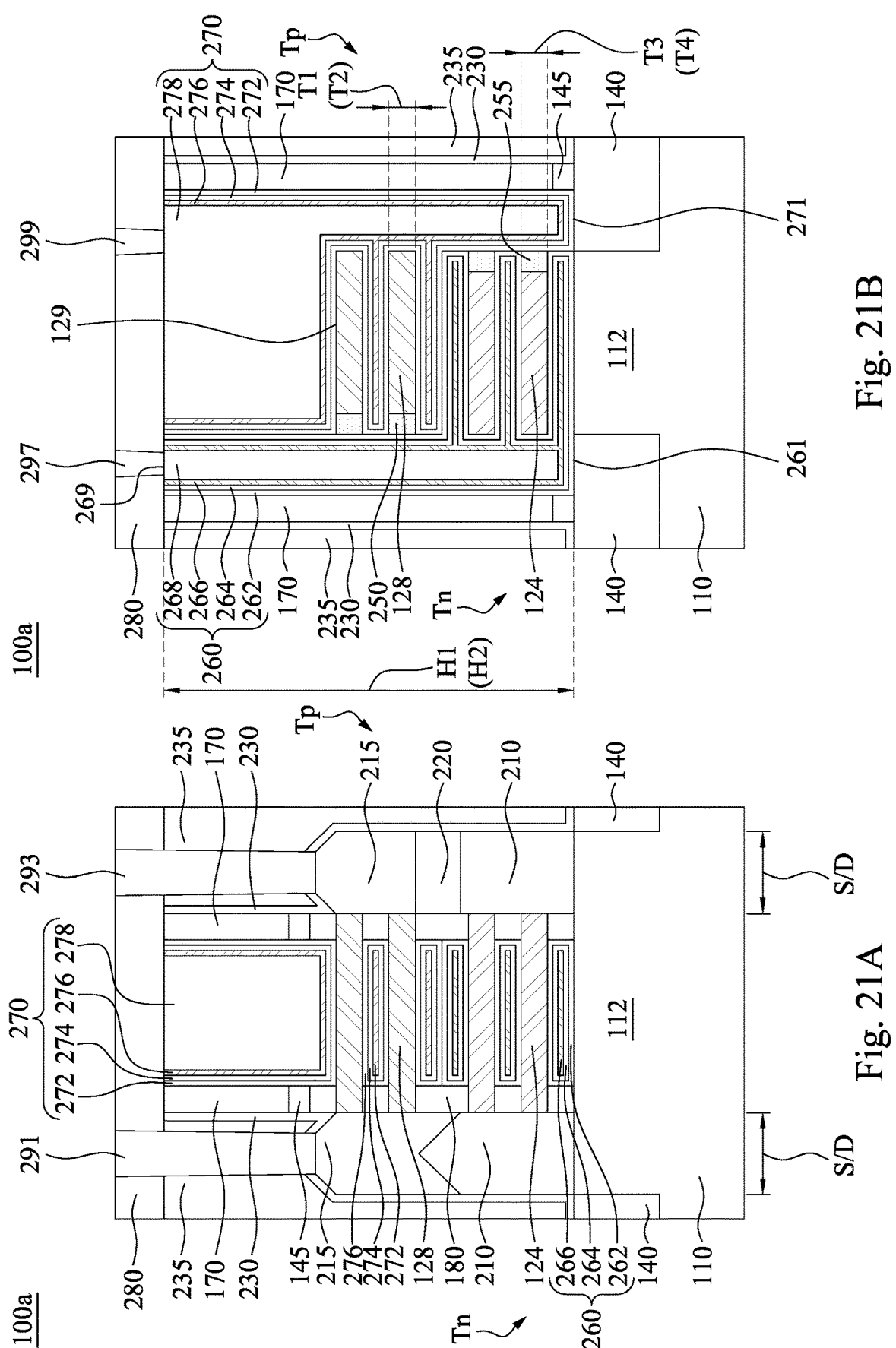
Figure 21C:
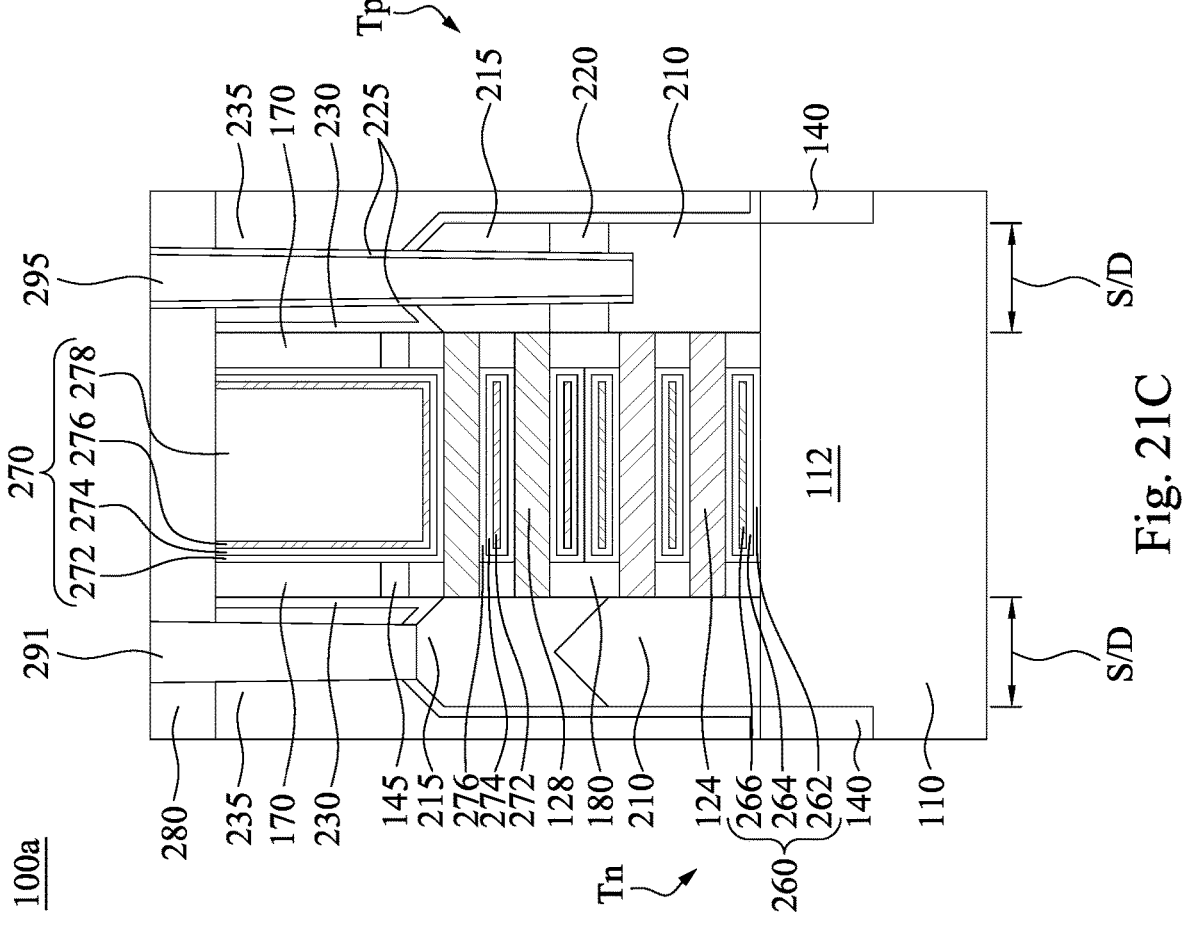

Reference is made to FIGS. 20A and 20B. Another gate structure 270 is formed in the openings O3 and O4. Formation of the gate structures 270 may include depositions to form various gate materials, one or more liner layers, and one or more CMP processes to remove excessive gate materials. Specifically, a gate dielectric layer of the gate structure 270 is formed in the openings O3 and O4 (see FIGS. 19A and 19B) and around the epitaxial layers 128. The gate dielectric layer includes an interfacial layer (e.g., silicon oxide layer) 272 and a high-k gate dielectric layer 274 over the interfacial layer 272. High-k gate dielectrics include dielectric materials having a high dielectric constant, for example, greater than that of thermal silicon oxide (~3.9). In some embodiments, the interfacial layer 272 of the gate dielectric layer may include a dielectric material such as silicon oxide ($SiO_2$), HfSiO, silicon oxynitride (SiON), SiBCN. SiOC, SiCN. The interfacial layer 272 may be formed by atomic layer deposition (ALD), chemical vapor deposition (CVD), and/or other suitable method. The high-k gate dielectric layer 274 of the gate dielectric layer may include hafnium oxide ($HfO_2$). Alternatively, the high-k gate dielectric layer 274 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (Al- SiO), aluminum oxide ($Al_2O_3$), silicon nitride ($Si_3N_4$), oxynitrides (SiON), PZT, VDF-TrFE (Ferroelectric polymer), and combinations thereof.

A work function metal layer 276 of the gate structure 270 is formed around the high-k gate dielectric layer 274. The work function metal layer 276 may include work function metals to provide a suitable work function for the gate structure 270. For a p-type FinFET, the work function metal layer 276 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

A fill metal 278 of the gate structure 270 is formed over the work function metal layer 276 and fills the opening(s) O3 (and O4). In some embodiments, the fill metal 278 may exemplarily include, but are not limited to, tungsten, platinum, aluminum, copper, nickel, cobalt, silver, gold, ruthenium, titanium, tantalum, titanium nitride, tantalum nitride, tungsten nitride, ruthenium oxide, nickel silicide, cobalt silicide, TaC. TaSiN, TaCN, TiAl, TiAlN, or other suitable materials.

Reference is made to FIGS. 21A, 21B, and 21C. Another ILD layer 280 is formed over the structure illustrated in FIGS. 20A and 20B. In some embodiments, the ILD layer 280 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and the like. In certain embodiments, the ILD layer 280 is formed of silicon oxide ($SiO_x$). The ILD layer 280 may be deposited by a PECVD process or other suitable deposition technique.

The ILD layers 235 and 280 are then patterned to form contact trenches on opposite sides of the gate structures 260 and 270, and then the CESL 230 is patterned to expose the source/drain epitaxial structures 210 and 215. In some embodiments, multiple etching processes are performed to pattern the ILD layers 235 and 280 and the CESL 230. The etching processes include dry etching process, wet etching process, or combinations thereof. Further, during etching the ILD layer 280, a plurality of via holes are formed in the ILD layer 280 to expose the gate structures 260 and 270.

Source/drain contacts 291, 293, and 295 are respectively formed in the contact trenches, and gate vias 297 and 299 are respectively formed in the via holes. The source/drain contact 291 is connected to one of the source/drain epitaxial structures 215 that in contact with one of the source/drain epitaxial structures 210. The source/drain contact 293 is connected to another one of the source/drain epitaxial structures 215 that over the isolation layer 220. The source/drain contact 295 is connected to another one of the source/drain epitaxial structures 210 that covered by the isolation layer 220. Further, a spacer layer 225 can be formed prior to form the source/drain contact 295, such that the source/drain contact 295 is electrically isolated from the source/drain epitaxial structure 215. The gate via 297 is connected to the gate structure 260, and the gate via 299 is connected to gate structure 270.

Formation of the source/drain contacts 291, 293, and 295 and the gate vias 297 and 299 includes depositing one or more conductive (e.g., metal) materials overfilling the contact trenches and the via holes, and then performing a CMP process to remove excessive metal materials outside the contact trenches and the via holes. In some embodiments, the formation of the spacer layer 225 may include blanket forming a dielectric layer and then performing etching operations to remove the horizontal portions of the dielectric layer. The remaining vertical portions of the dielectric layer form the spacer layer 225. The spacer layer 225 includes one or more dielectric materials, such as silicon oxide, silicon nitride, silicon oxynitride, SiCN, SiCxOyNz, high-k dielectric materials, or combinations thereof. The spacer layer 225 can be formed using a deposition method, such as plasma enhanced chemical vapor deposition (PECVD), plasma enhanced atomic layer deposition (PEALD), or the like.

In FIGS. 21A-21C, the integrated circuit structure 100a includes a bottom (nanostructure) transistor Tn and a top (nanostructure) transistor Tp over the bottom transistor Tn. The bottom transistor Tn includes channel layers (the epitaxial layers) 124, the gate structure 260 wrapping around the channel layers 124, and the source/drain epitaxial structures 210 on opposite sides and connected to the channel layers 124. The top transistor Tp includes channel layers (the epitaxial layers) 128, the gate structure 270 wrapping around the channel layers 128, and the source/drain epitaxial structures 215 on opposite sides and connected to the channel layers 128. In some embodiments, the bottom transistor Tn is an N-type transistor, and the top transistor Tp is a P-type transistor. In some other embodiments, the bottom transistor Tn is a P-type transistor, and the top transistor Tp is an N-type transistor.

The gate structures 260 and 270 are fork-sheet gate structures. That is, the gate structure 260 is in contact with three sides of each of the channel layers 124 and is spaced apart from one side of each of the channel layers 124. Similarly, the gate structure 270 is in contact with three sides of each of the channel layers 128 and is spaced apart from one side of each of the channel layers 128. A height H1 of the gate structure 260 is substantially the same as a height H2 of the gate structure 270. As shown in FIGS. 21A-21C, portions of the gate structure 270 are directly over the gate structure 260. Further, the gate structure 260 is spaced apart from the channel layers 128, and the gate structure 270 is spaced apart from the channel layers 124. A bottom surface 261 of the gate structure 260 is substantially coplanar with a bottom surface 271 of the gate structure 270. Further, the gate structures 260 and 270 both are in contact with the isolation structure 140, which is embedded in the substrate 110. A top surface 269 of the gate structure 260 is higher than a top surface 129 of the channel layer 128. The interfacial layer 262 of the gate structure 260 is in contact with the interfacial layer 272 of the gate structure 270. Therefore, the gate structure 260 is electrically isolated from the gate structure 270.

The integrated circuit structure 100a further includes the dielectric blocking layers 250 directly between the channel layers 128 and the gate structure 260. That is, the opposite sides of the dielectric blocking layers 250 are in contact with the channel layers 128 and the gate structure 260, respectively. The dielectric blocking layers 250 are surrounded by the gate structures 260 and 270 and in contact with the channel layers 128. Further, a vertical thickness T1 of the dielectric blocking layer 250 is substantially the same as a vertical thickness T2 of the channel layer 128. Moreover, the dielectric blocking layers 250 are directly over the channel layers 124. The integrated circuit structure 100a further includes the dielectric blocking layers 255 directly between the channel layers 124 and the gate structure 270. That is, the opposite sides of the dielectric blocking layers 255 are in contact with the channel layers 124 and the gate structure 270, respectively. The dielectric blocking layers 255 are surrounded by the gate structures 260 and 270 and in contact with the channel layers 124. Further, a vertical thickness T3 of the dielectric blocking layer 255 is substantially the same as a vertical thickness T4 of the channel layer 124. Moreover, the dielectric blocking layers 255 are directly under the channel layers 128.

The integrated circuit structure 100a further includes the inner spacers 180. As shown in FIGS. 21A and 21C, at least one of the inner spacers 180 is in contact with both the gate structures 260 and 270 and both the channel layers 124 and 128. The integrated circuit structure 100a further includes the gate spacer 170. As shown in FIGS. 21A-21C, the gate spacer 170 surrounds the gate structures 260 and 270. Stated another way, the gate spacer 170 is in contact with the gate structures 260 and 270.

Figure 22:
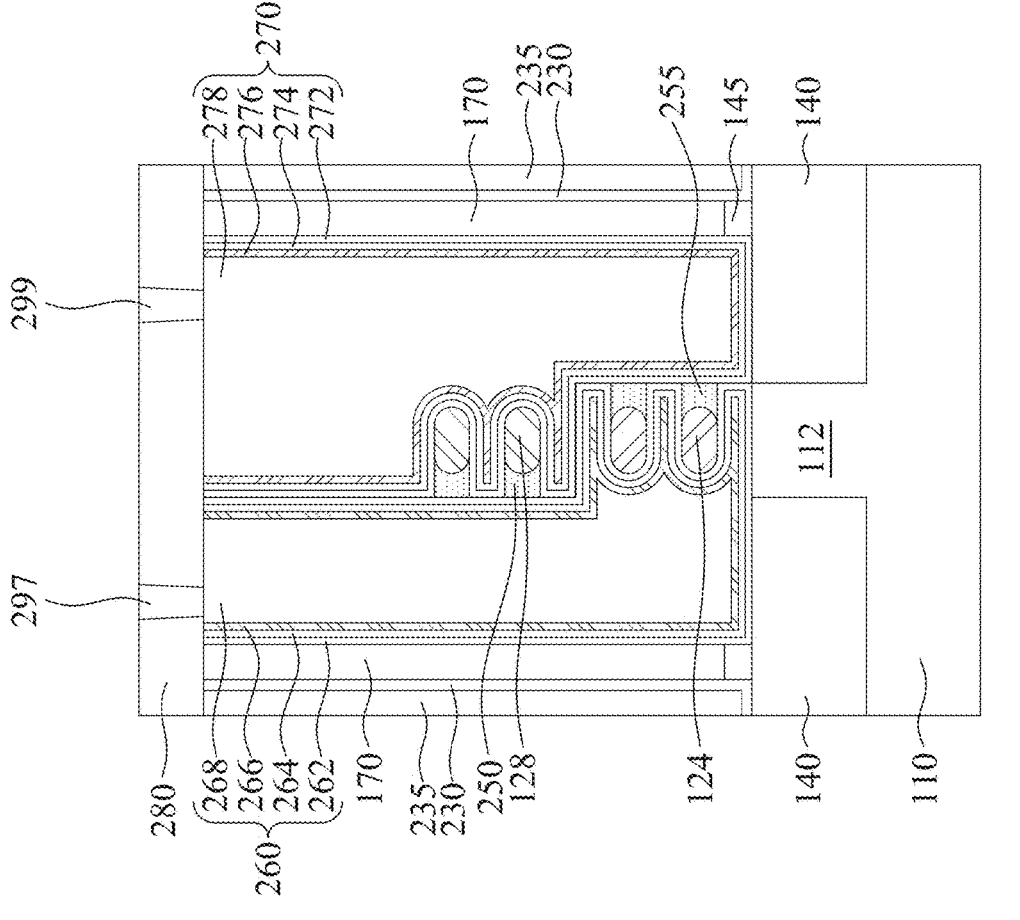
FIG. 22 is a cross-sectional view of an integrated circuit structure (or a semiconductor device) in accordance with some embodiments of the present disclosure.

FIG. 22 is a cross-sectional view of an integrated circuit structure (or a semiconductor device) 100b in accordance with some embodiments of the present disclosure. The difference between the integrated circuit structures 100b and 100a pertains to the shape of the channels. In FIG. 22, the epitaxial layers 124 and 128 are nanowires, and the opposite end surfaces of the epitaxial layers 124 and 128 may be curved (e.g., convex). Thus, an interface between the epitaxial layer 124 (or 128) and the dielectric blocking layer 250 (or 255) is curved, and the surface of the dielectric blocking layer 250 (or 255) in contact with the epitaxial layer 124 (or 128) is concave. In some embodiments, the dimensions (width/length/diameter) of the epitaxial layers 124 and 128 (both in FIGS. 22 and 21B) are in a range from about 0.1 nm to about 1 um. In some other embodiments, the cross section of the channel layers 124 and 128 may be circular shapes, elliptical shapes, diamond shapes, or the like. Other features of the integrated circuit structure 100b are similar to or the same as those of the integrated circuit structure 100a shown in FIGS. 1-21C, and therefore, a description in this regard will not be provided hereinafter.

Figure 24:
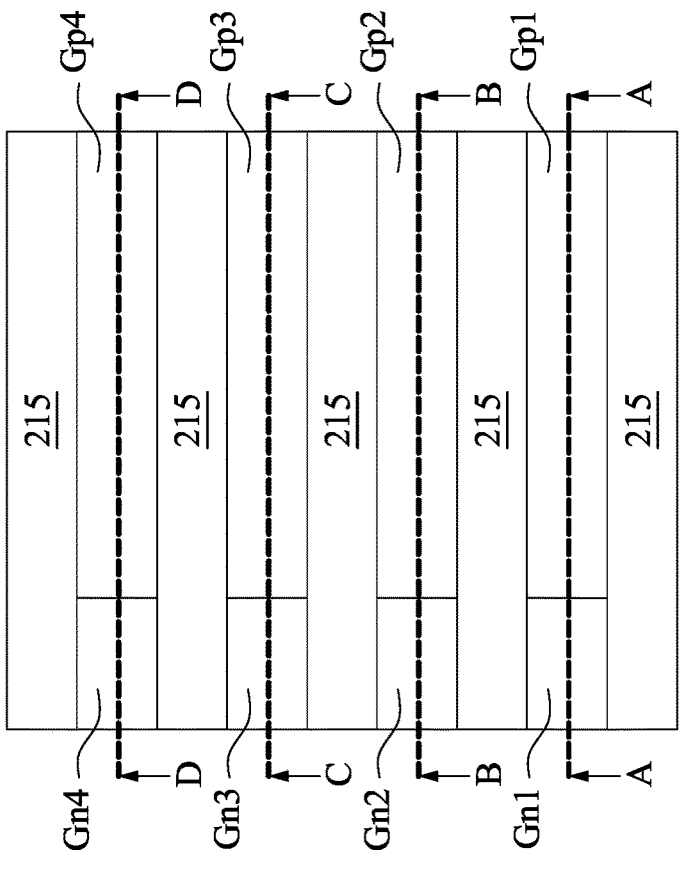
FIG. 24 illustrates a top view of the tristate buffer logic circuit in accordance with some embodiments of the present disclosure.
Figure 23:
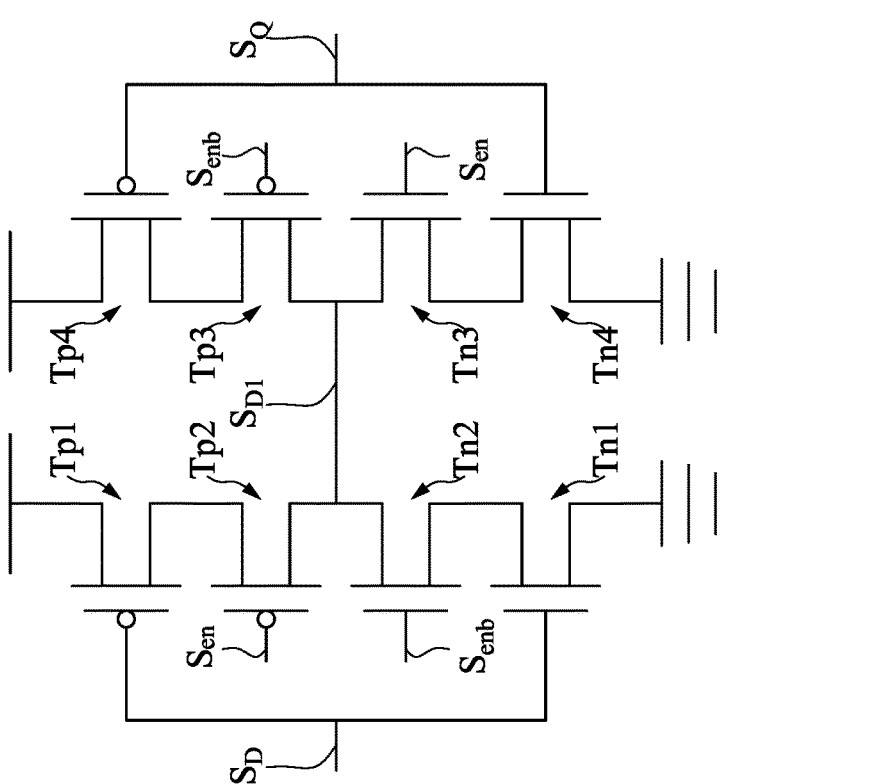
FIG. 23 is a circuit diagram of the tristate buffer logic circuit in accordance with some embodiments of the present disclosure.
Figures 25A, 25B:
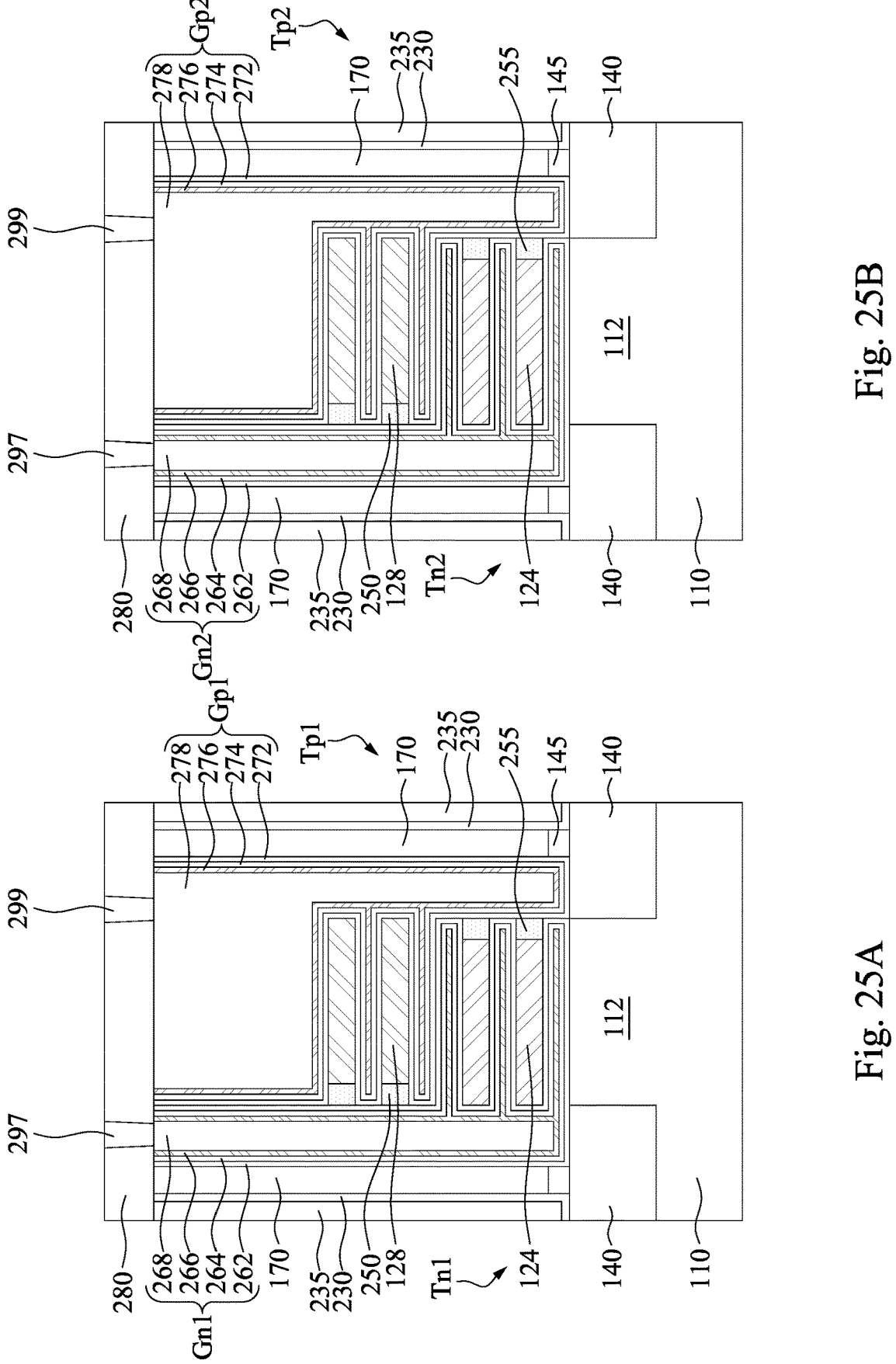
FIGS. 25A-25D illustrate cross-sectional views taken along lines A-A, B-B, C-C, and D-D of FIG. 24, respectively.
Figures 25C, 25D:
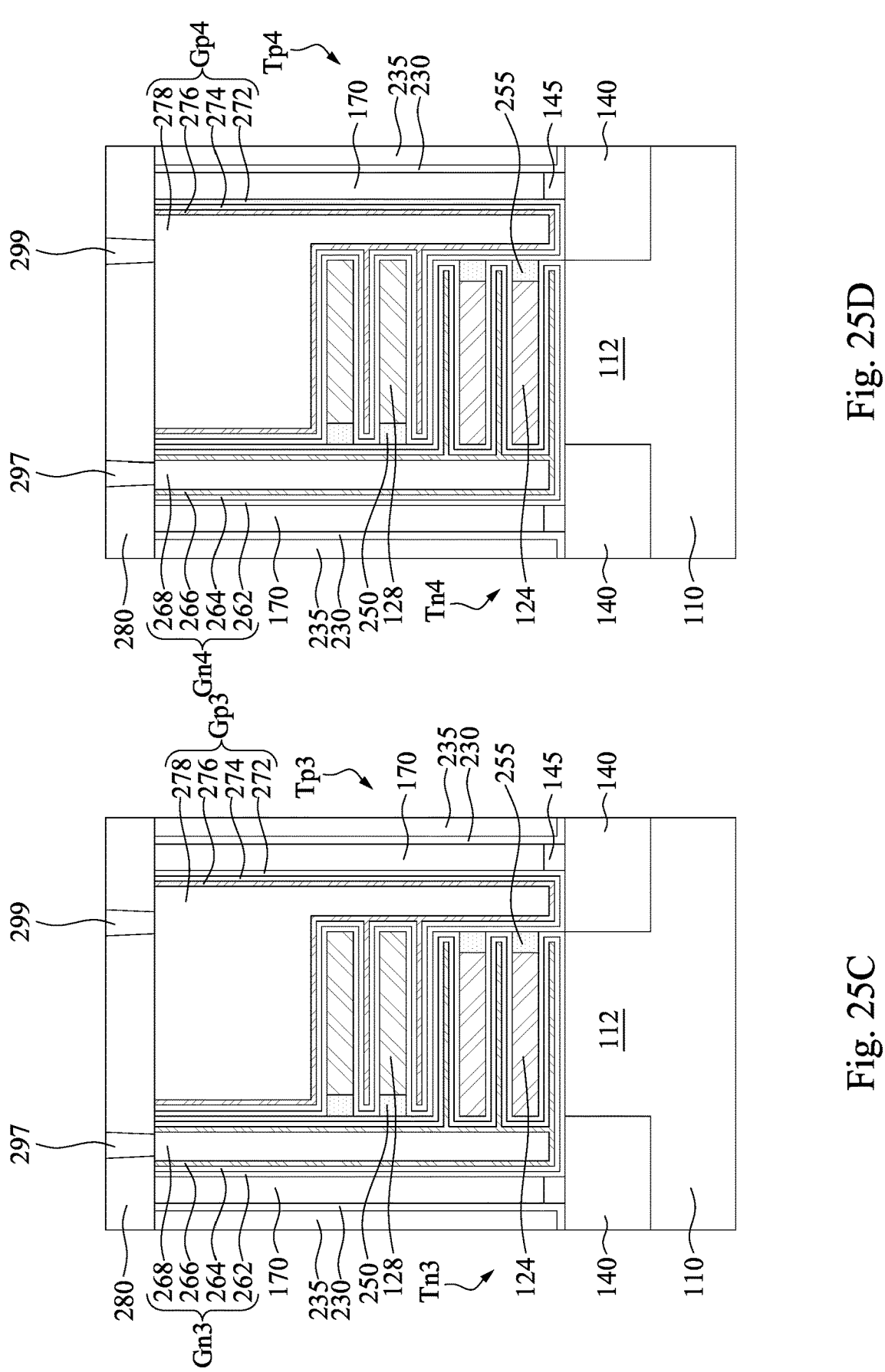

In some embodiments, the integrated circuit structures 100a and 100b can be applied to a tristate buffer logic circuit. FIG. 23 is a circuit diagram of the tristate buffer logic circuit 10 in accordance with some embodiments of the present disclosure, FIG. 24 illustrates a top view of the tristate buffer logic circuit 10 in accordance with some embodiments of the present disclosure, FIGS. 25A-25D illustrate cross-sectional views taken along lines A-A, B-B, C-C, and D-D of FIG. 24, respectively. For clarity, FIG. 24 only illustrates locations of gates and source/drains (e.g., the source/drain epitaxial structures 215) of the tristate buffer logic circuit 10.

Specifically, the tristate buffer logic circuit 10 includes transistors Tn1, Tn2, Tn3, Tn4, Tp1, Tp2, Tp3, and Tp4. The transistors Tp1, Tp2, Tn2, and Tn1 are connected in series, and the transistors Tp4, Tp3, Tn3, and Tn3 are connected in series. Further, the sources of the transistors Tp2, Tp3, Tn2, and Tn3 are connected to each other and coupled to an input signal SD1. An input signal Sp is coupled to the gates Gp1 and Gn1 of the transistors Tp1 and Tn1 (see FIGS. 23, 24, and 25A), an input signal $S_{en}$ is coupled to the gates Gp2 and Gn3 of the transistors Tp2 and Tn3 (see FIGS. 23, 24, 25B, and 25C), an input signal $S_{enb}$ is coupled to the gates Gp3 and Gn2 of the transistors Tp3 and Tn2 (see FIGS. 23, 24, 25B, and 25C), and an input signal $S_Q$ is coupled to the gates Gp4 and Gn4 of the transistors Tp4 and Tn4 (see FIGS. 23, 24, and 25D). As shown in FIG. 24, since the gates Gp2 and Gn2 can be stacked and controlled individually, the layout area of the tristate buffer logic circuit 10 is dense and the standard cell area of the circuit is reduced.

Figures 26A, 26B:
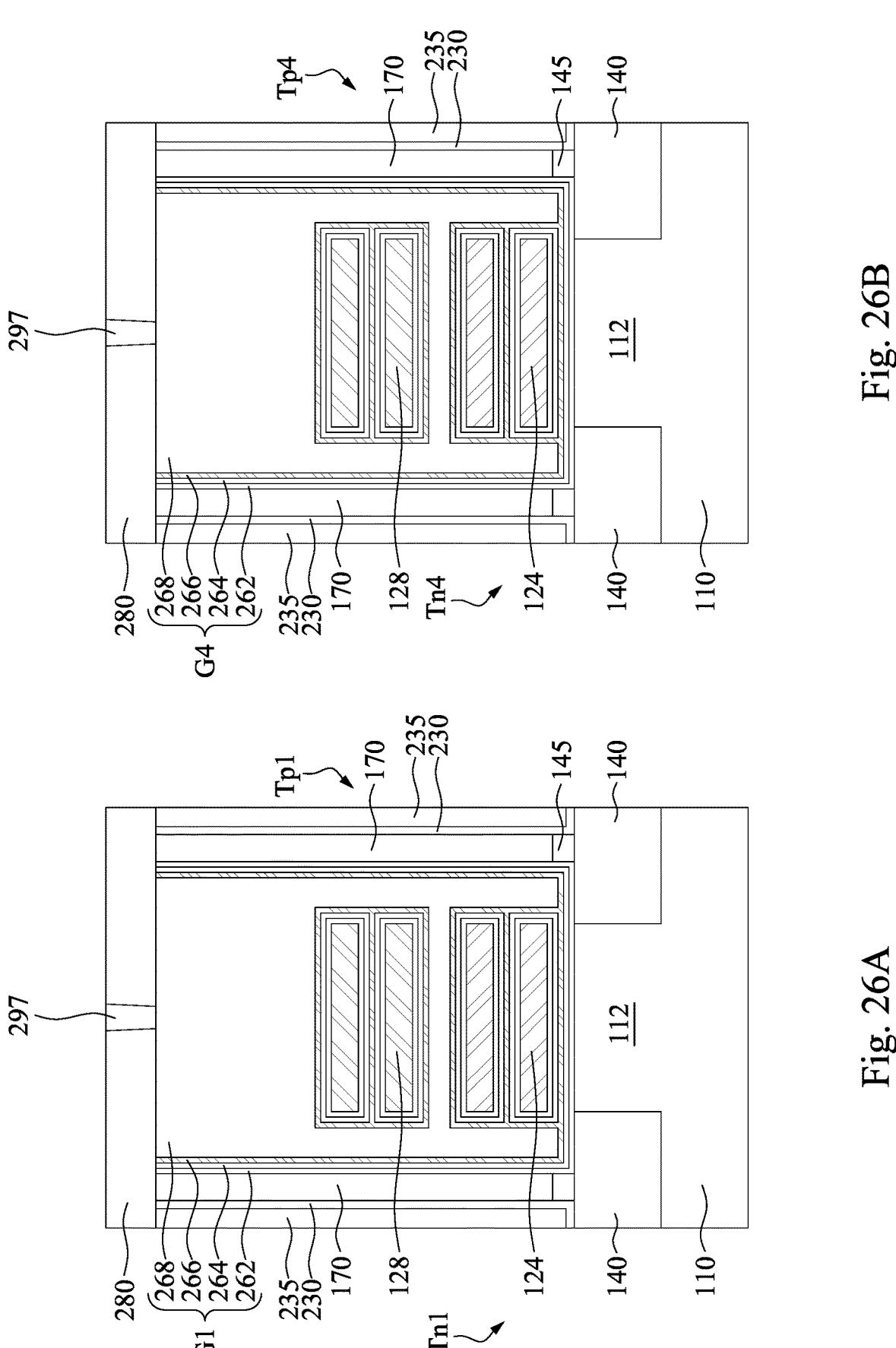
FIGS. 26A and 26B illustrate cross-sectional views taken along lines A-A and D-D of FIG. 24, respectively, in accordance with some embodiments of the present disclosure.

FIGS. 26A and 26B illustrate cross-sectional views taken along lines A-A and D-D of FIG. 24, respectively, in accordance with some embodiments of the present disclosure. Since the gates Gp1 and Gn1 (see FIG. 25A) are both connected to the input signal SD, the gates of the transistors Tp1 and Tn1 can be combined as a common gate G1, which may have a configuration similar to or the same as the gate structure 260 (or 270) as shown in FIG. 21B. Therefore, the dielectric blocking layers 250 and 255 (see FIG. 25A) can be omitted. Similarly, since the gates Gp4 and Gn4 (see FIG. 25D) are both connected to the input signal $S_Q$, the gates of the transistors Tp4 and Tn4 can be combined as a common gate G4, which may have a configuration similar to or the same as the gate structure 260 (or 270) as shown in FIG. 21B. Therefore, the dielectric blocking layers 250 and 255 can be omitted. Other features of the tristate buffer logic circuit 10 are similar to or the same as those of the integrated circuit structure 100a shown in FIGS. 1-21C, and therefore, a description in this regard will not be provided hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the individual gate structures allow independent gate controls. Further, the layout area of the gate structures is substantially the same as that of a common gate structure, such that the design flexibility of the circuit is increased without increasing the layout area thereof. Moreover, the fork-sheet gate structures provide gate controls as good as nanosheet gate structures.

According to some embodiments, an integrated circuit structure includes a substrate, a bottom nanostructure transistor, and a top nanostructure transistor. The bottom nanostructure transistor is over the substrate and includes a first channel layer, a first gate structure, and first source/drain epitaxial structures. The first gate structure wraps around the first channel layer. The first source/drain epitaxial structures are on opposite sides of the first channel layer. The top nanostructure transistor is over the bottom nanostructure transistor and includes a second channel layer, a second gate structure, and second source/drain epitaxial structures. The second channel layer is over the first channel layer. The second gate structure wraps around the second channel layer. A bottom surface of the second gate structure is substantially coplanar with a bottom surface of the first gate structure. The second source/drain epitaxial structures are on opposite sides of the second channel layer.

According to some embodiments, an integrated circuit structure includes a substrate, an isolation structure, a bottom nanostructure transistor, and a top nanostructure transistor. The isolation structure is embedded in the substrate. The bottom nanostructure transistor is over the substrate and includes a first gate structure having a first fork-sheet shape, a first channel layer surrounded by the first gate structure, and first source/drain epitaxial structures on opposite sides of the first channel layer. The top nanostructure transistor is over the bottom nanostructure transistor and includes a second gate structure having a second fork-sheet shape, a second channel layer surrounded by the second gate structure, and second source/drain epitaxial structures on opposite sides of the second channel layer. The first gate structure and the second gate structure both are in contact with the isolation structure, and the first gate structure is electrically isolated from the second gate structure.

According to some embodiments, a method includes forming a fin structure over a substrate, wherein the fin structure includes a first channel layer, a first sacrificial layer, a second sacrificial layer, and a second channel layer sequentially stacked from bottom to top; forming a dummy gate structure to cover the fin structure; forming a gate spacer to surround the dummy gate structure; removing the dummy gate structure to form a gate trench defined by the gate spacer; forming first source/drain epitaxial structures on opposite sides of the first channel layer and second source/drain epitaxial structures on opposite sides of the second channel layer; removing the first sacrificial layer to release the first channel layer; forming a first fork-sheet gate structure in the gate trench to surround the first channel layer, wherein the first fork-sheet gate structure is in contact with the second sacrificial layer; removing the second sacrificial layer to release the second channel layer; and forming a second fork-sheet gate structure in the gate trench to surround the second channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a fin structure over a substrate, wherein the fin structure comprises a first channel layer, a first sacrificial layer, a second sacrificial layer, and a second channel layer sequentially stacked from bottom to top;
forming a dummy gate structure to cover the fin structure;
forming a gate spacer to surround the dummy gate structure;
forming first source/drain epitaxial structures on opposite sides of the first channel layer and second source/drain epitaxial structures on opposite sides of the second channel layer;
removing the dummy gate structure to form a gate trench defined by the gate spacer;
removing the first sacrificial layer to release the first channel layer;
forming a first fork-sheet gate structure in the gate trench to surround the first channel layer, wherein the first fork-sheet gate structure is in contact with the second sacrificial layer;
removing the second sacrificial layer to release the second channel layer; and
forming a second fork-sheet gate structure in the gate trench to surround the second channel layer.

2. The method of claim 1, further comprising forming a dielectric blocking layer on an end surface of the second channel layer prior to forming the first fork-sheet gate structure.

3. The method of claim 2, further comprising forming an inner spacer on an end surface of the first sacrificial layer prior to forming the dielectric blocking layer.

4. The method of claim 1, wherein the first channel layer, the first sacrificial layer, the second sacrificial layer, and the second channel layer have different germanium concentrations.

5. The method of claim 1, wherein the first fork-sheet gate structure is exposed after removing the second sacrificial layer.

6. The method of claim 1, wherein forming the second fork-sheet gate structure comprises:

depositing a gate dielectric layer in the gate trench and in contact with the first fork-sheet gate structure and the second channel layer; and depositing a metal layer over the gate dielectric layer.

7. The method of claim 6, wherein a bottom surface of the metal layer of the second fork-sheet gate structure is lower than a bottom surface of the first channel layer.

8. A method comprising:

forming a stacking structure over a substrate, wherein the stacking structure comprises a first sacrificial layer, a first channel layer, a second sacrificial layer, and a second channel layer sequentially stacked from bottom to top;

forming a dummy gate structure across the stacking structure;

forming a gate spacer structure surrounding the dummy gate structure;

removing the dummy gate structure to form a gate trench defined by the gate spacer structure;

after forming the gate trench, recessing the second channel layer to form a first recess in the second channel layer;

forming a first dielectric structure in the first recess of the second channel layer;

after forming the first dielectric structure, removing the first sacrificial layer to release the first channel layer;

forming a first metal gate structure in the gate trench and surrounding the first channel layer;

removing the second sacrificial layer to release the second channel layer; and forming a second metal gate structure in the gate trench and surrounding the second channel layer.

9. The method of claim 8, wherein after forming the second metal gate structure, the first dielectric structure is in contact with the first metal gate structure and the second metal gate structure.

10. The method of claim 8, further comprising:

recessing the first channel layer to form a second recess in the first channel layer after forming the first metal gate structure and prior to removing the second sacrificial layer; and forming a second dielectric structure in the second recess prior to removing the second sacrificial layer.

11. The method of claim 10, wherein the second recess is defined by the first metal gate structure and the first channel layer.

12. The method of claim 10, wherein after forming the second metal gate structure, the second dielectric structure is in contact with the first metal gate structure and the second metal gate structure.

13. The method of claim 8, further comprising:

depositing an interlayer dielectric (ILD) layer over the first metal gate structure and the second metal gate structure;

forming a first gate via in the ILD layer and connected to the first metal gate structure; and forming a second gate via in the ILD layer and connected to the second metal gate structure.

14. The method of claim 13, wherein a bottom of the first gate via is at a position substantially level with a bottom of the second gate via.

15. A method comprising:

forming a stacking structure over a protruding portion of a substrate, wherein the stacking structure comprises a first sacrificial layer, a first channel layer, a second sacrificial layer, and a second channel layer sequentially stacked from bottom to top;

forming a first isolation structure and a second isolation structure on opposite sides of the protruding portion of the substrate;

forming a dummy gate structure across the stacking structure;

forming a gate spacer structure to surround the dummy gate structure;

removing the dummy gate structure to form a gate trench defined by the gate spacer structure;

removing the first sacrificial layer to release the first channel layer;

forming a first metal gate structure in the gate trench and in contact with the first channel layer and the first isolation structure;

forming a first dielectric structure on a sidewall of the first channel layer after forming the first metal gate structure;

after forming the first dielectric structure, removing the second sacrificial layer to release the second channel layer; and forming a second metal gate structure in the gate trench and in contact with the second channel layer and the second isolation structure.

16. The method of claim 15, wherein after forming the second metal gate structure, a top surface of the first metal gate structure is higher than a top surface of the second channel layer.

17. The method of claim 15, wherein after forming the first metal gate structure, the second isolation structure is exposed in the gate trench.

18. The method of claim 15, wherein the first dielectric structure is in contact with the first metal gate structure.

19. The method of claim 15, wherein a height of the first metal gate structure is substantially the same as a height of the second metal gate structure.

20. The method of claim 15, further comprising forming a second dielectric structure on a sidewall of the second channel layer prior to forming the first metal gate structure.

* * * * *